United States Patent
Matsuda et al.

(10) Patent No.: US 9,595,658 B2
(45) Date of Patent: Mar. 14, 2017

(54) PIEZOELECTRIC MATERIAL PIEZOELECTRIC DEVICE AND ELECTRONIC APPARATUS

(71) Applicant: CANON KABUSHIKI KAISHA, Tokyo (JP)

(72) Inventors: Takanori Matsuda, Chofu (JP); Takayuki Watanabe, Yokohama (JP); Shunsuke Murakami, Kawasaki (JP); Miki Ueda, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/175,392

(22) Filed: Jun. 7, 2016

(65) Prior Publication Data

US 2016/0284976 A1    Sep. 29, 2016

Related U.S. Application Data

(63) Continuation of application No. 14/763,974, filed as application No. PCT/JP2014/052187 on Jan. 24, 2014, now Pat. No. 9,379,310.

(30) Foreign Application Priority Data

Jan. 29, 2013    (JP) ................................ 2013-014616

(51) Int. Cl.
*G02B 1/00* (2006.01)
*H01L 41/187* (2006.01)
(Continued)

(52) U.S. Cl.
CPC ........ *H01L 41/1873* (2013.01); *H01L 41/083* (2013.01); *H01L 41/18* (2013.01)

(58) Field of Classification Search
CPC ... H01L 41/43; H01L 41/187; H01L 41/0973; H01L 41/09; H01L 41/1871;
(Continued)

(56) References Cited

U.S. PATENT DOCUMENTS

2012/0133210 A1*    5/2012    Moon .................. H01L 41/113
310/339

FOREIGN PATENT DOCUMENTS

CN    101621112 A    1/2010
CN    101834269 A    9/2010

OTHER PUBLICATIONS

Shihui Xie, et al., "Microstructure and electrical properties of NaNbO3—BaTiO3 lead-free piezoelectric ceramics", Front Mech Eng China 2009, 4(3): 345-349.

* cited by examiner

*Primary Examiner* — Euncha Cherry
(74) *Attorney, Agent, or Firm* — Canon U.S.A., Inc. IP Division

(57) ABSTRACT

A piezoelectric material that does not use lead and potassium and has a high piezoelectric constant and good insulating properties and a piezoelectric element that uses the piezoelectric material are provided. The piezoelectric material contains a perovskite-type metal oxide represented by general formula (1): $(Na_xBa_{1-y})(Nb_yTi_{1-y})O_3$ (1) (where $0.80 \leq x \leq 0.95$ and $0.85 \leq y \leq 0.95$), and an auxiliary component containing at least one selected from the group consisting of Si and B. A content of the auxiliary component on a metal basis is 0.001 parts by weight or more and 4.000 parts by weight or less relative to 100 parts by weight of the perovskite-type metal oxide.

9 Claims, 14 Drawing Sheets

(51) Int. Cl.
*H01L 41/18* (2006.01)
*H01L 41/083* (2006.01)

(58) Field of Classification Search
CPC ..... H01L 41/1873; H01L 41/24; H01L 41/18;
H01L 41/00; H01L 41/1878; B41J 2/14;
B41J 21/14233; C04B 35/495; C04B
35/4682; H02N 2/10; H02N 2/16; H02N
21/163; G02B 7/10; G02B 21/163
USPC .... 359/507, 824; 252/62.9 PZ, 62.9, 62.9 R;
310/365, 366, 323.02, 358
See application file for complete search history.

PIEZOELECTRIC MATERIAL PIEZOELECTRIC DEVICE AND ELECTRONIC APPARATUS

CROSS-REFERENCE TO RELATED APPLICATIONS

This application is a continuation of U.S. application Ser. No. 14/763,974, filed Jul. 28, 2015, which is a National Stage filing of International Application No. PCT/JP2014/052187 filed Jan. 24, 2014, which claims the benefit of Japanese Patent Application No. 2013-014616, filed Jan. 29, 2013, the disclosures of each of which are hereby incorporated by reference herein in their entirety.

Technical Field

The present invention generally relates to piezoelectric materials. In particular, it relates to a lead-free piezoelectric material. The present invention also relates to a piezoelectric element, a multilayered piezoelectric element, a liquid discharge head, a liquid discharge apparatus, an ultrasonic motor, an optical apparatus, a vibrating apparatus, a dust removing device, an image pickup apparatus, and an electronic apparatus that use the piezoelectric material.

Background Art

Lead-containing lead zirconate titanate is a representative example of piezoelectric materials and is used in a wide variety of piezoelectric elements such as actuators, oscillators, sensors, and filters. Once lead-containing piezoelectric elements are discarded and exposed to acid rain, the lead component in the piezoelectric material may seep into the ground and harm the ecosystem. Accordingly, development and studies of lead-free piezoelectric materials have been actively pursued in order to make lead-free piezoelectric elements.

A most widely studied representative example of lead-free piezoelectric materials is a piezoelectric material that contains potassium niobate. However, in synthesizing a piezoelectric material containing potassium, it is difficult to accurately weigh raw material powders to desired molar ratios due to highly hygroscopic nature of the raw material powders (such as potassium carbonate powder). Moreover, a piezoelectric material that contains potassium niobate ($KNbO_3$) is deliquescent and there have been instances where piezoelectricity of piezoelectric ceramics that contain potassium niobate is degraded with the lapse of time.

NPL 1 reports a piezoelectric material that is free of lead or potassium. This piezoelectric material is a solid solution of sodium niobate ($NaNbO_3$) and barium titanate ($BaTiO_3$) (hereinafter this solid solution is referred to as "NN-BT"). NPL 1 reports that the piezoelectric constant $d_{33}$ of a piezoelectric ceramic that contained sodium niobate and barium titanate at a 9:1 ratio was 147 pC/N.

PTL 1 offers a method for producing a niobate-based piezoelectric ceramic having a high Curie temperature Tc and good piezoelectric properties. PTL 1 discloses that the piezoelectric constant $d_{33}$ of a niobate-based piezoelectric ceramic which was a solid solution of NN-BT and strontium titanate ($SrTiO_3$) was 14 to 126 pm/V.

CITATION LIST

Patent Literature

PTL 1 Japanese Patent Laid-Open No. 2008-156172

Non Patent Literature

NPL 1 J. T. Zeng et al., "Journal of the American Ceramic Society" 2006, vol. 89, pp. 2828 to 2832

SUMMARY OF INVENTION

Technical Problem

The problem of the related art is that the piezoelectric performance of NN-BT is insufficient.

The present invention provides a piezoelectric material that is free of lead and potassium, has a high piezoelectric constant, and exhibits good insulating property. A piezoelectric element, a multilayered piezoelectric element, a liquid discharge head, a liquid discharge apparatus, an ultrasonic motor, an optical apparatus, a vibrating apparatus, a dust removing device, an imaging apparatus, and an electronic apparatus that include the piezoelectric material are also provided.

Solution to Problem

A piezoelectric material according to an embodiment of the invention includes a perovskite-type metal oxide represented by general formula (1) below:

$$(Na_xBa_{1-x})(Nb_yTi_{1-y})O_3 \quad (1)$$

(where $0.80 \leq x \leq 0.95$ and $0.85 \leq y \leq 0.95$), and an auxiliary component containing at least one selected from the group consisting of Si and B. A content of the auxiliary component on a metal basis is 0.001 parts by weight or more and 4.000 parts by weight or less relative to 100 parts by weight of the perovskite-type metal oxide.

A piezoelectric element according to an embodiment of the invention includes a first electrode, a piezoelectric material portion, and a second electrode. The piezoelectric material portion contains the piezoelectric material described above.

A multilayered piezoelectric element according to an embodiment of the invention includes two or more piezoelectric material layers and electrode layers including one or more internal electrodes. The piezoelectric material layers and the electrode layers are alternately stacked and the piezoelectric material layers contain the piezoelectric material described above.

A liquid discharge head according to an embodiment of the invention includes a liquid chamber that includes a vibrating unit that includes the piezoelectric element or the multilayered piezoelectric element described above, and a discharge port communicating with the liquid chamber.

A liquid discharge apparatus according to an embodiment of the invention includes a stage configured to receive an object and the liquid discharge head described above.

An ultrasonic motor according to an embodiment of the invention includes a vibrating body that includes the piezoelectric element or the multilayered piezoelectric element described above, and a moving body configured to come into contact with the vibrating body.

An optical apparatus according to an embodiment of the invention includes a drive unit that includes the ultrasonic motor described above.

A vibrating apparatus according to an embodiment of the invention includes a vibrating body that includes the piezoelectric element or the multilayered piezoelectric element described above.

A dust removing device according to an embodiment of the invention includes a vibrating unit that includes the vibrating apparatus described above.

An image pickup apparatus according to an embodiment of the invention includes the dust removing device described above and an image pickup element unit. A vibrating member of the dust removing device is disposed on a light-receiving-surface side of the image pickup element unit.

An electronic apparatus according to an embodiment of the invention includes a piezoelectric acoustic component that includes the piezoelectric element or the multilayered piezoelectric element described above.

Advantageous Effects of Invention

According to the present invention, a piezoelectric material that is free of lead and potassium and has a high piezoelectric constant and good insulating properties can be provided. A piezoelectric element, a multilayered piezoelectric element, a liquid discharge head, a liquid discharge apparatus, an ultrasonic motor, an optical apparatus, a vibrating apparatus, a dust removing device, an image pickup apparatus, and an electronic apparatus that use the piezoelectric material can also be provided.

The piezoelectric material of the present invention is lead free and has low impact on the environment. Moreover, since no potassium is contained, sinterability and moisture resistance are also high.

DESCRIPTION OF EMBODIMENTS

Figure 1:
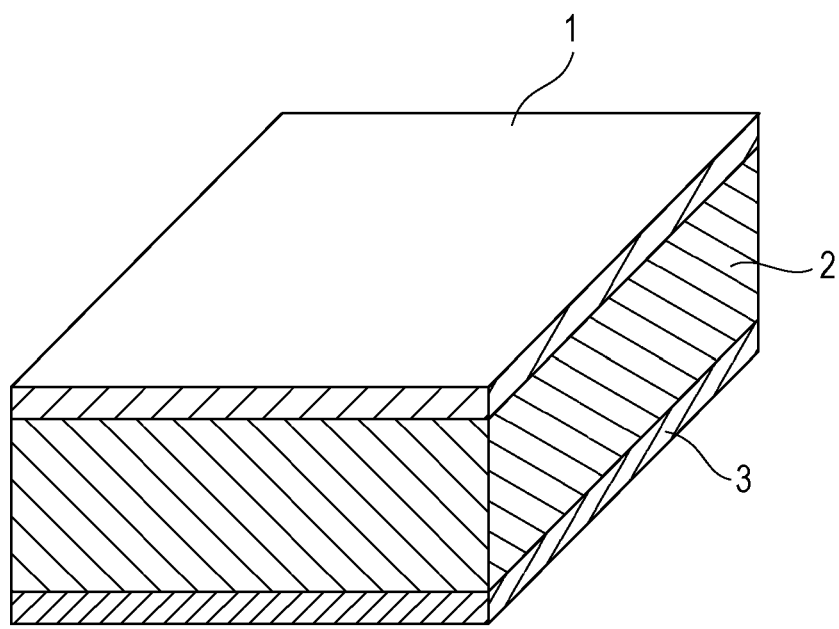
FIG. 1 is a schematic diagram of a piezoelectric element according to one embodiment of the invention.

Embodiments of the present invention will now be described.

According to an embodiment, a piezoelectric material that is based on NN-BT and free of lead or potassium and exhibits good piezoelectricity and insulating properties is provided. The piezoelectric material can be used in a variety of devices such as capacitors, memories, and sensors by utilizing its dielectric properties.

A piezoelectric material according to an embodiment contains a perovskite-type metal oxide represented by general formula (1) below and at least one auxiliary component selected from Si and B:

$$(Na_xBa_{1-y})(Nb_yTi_{1-y})O_3 \qquad (1)$$

where $0.80 \leq x \leq 0.95$ and $0.85 \leq y \leq 0.95$.

The content of the auxiliary component relative to 100 parts by weight of the perovskite-type metal oxide is 0.001 parts by weight or more and 4.000 parts by weight or less on a metal basis.

For the purposes of the present invention, a "perovskite-type metal oxide" refers to a metal oxide that has a perovskite-type structure that is ideally a cubic crystal structure as defined by Iwanami Rikagaku Jiten, 5th edition (published Feb. 20, 1998 by Iwanami Shoten Publishers). A metal oxide having a perovskite-type structure is generally expressed by a chemical formula $ABO_3$. Element A and element B of a perovskite-type metal oxide respectively occupy particular positions in the unit cell called A sites and B sites by taking forms of ions. For example, in a unit cell of a cubic crystal, element A occupies apexes of a cube and element B occupies the body center of the cube. Element O is an oxygen anion and occupies face-centered positions of the cube.

The perovskite-type metal oxide (hereinafter may be simply referred to as "metal oxide") represented by general formula (1) above contains Na and Ba as the metal elements that occupy the A sites and Nb and Ti as the metal elements that occupy the B sites. Some of Na and Ba atoms may occupy B sites as well and some of Ti and Nb atoms may occupy A sites as well.

The molar ratio of the B-site element to element O in general formula (1) is 1:3. The molar ratio may slightly deviate from this ratio (for example, 1.00:2.94 to 1.00:3.06) as long as the metal oxide has a perovskite-type structure as the primary phase. Such an oxide is still in the range of the present invention. The fact that the metal oxide has a perovskite-type structure can be confirmed by structural analysis by X-ray diffraction, electron-beam diffraction, or the like.

The form of the piezoelectric material according to the embodiment is not particularly limited. The piezoelectric material may be a ceramic, a powder, a single crystal, a film, or a slurry, for example. The piezoelectric material is preferably a ceramic. For the purposes of the present invention, the term "ceramic" means a polycrystal, that is, an aggregate (also called bulk) of crystal grains sintered through a heat treatment, containing a metal oxide as a basic component. Those materials which are processed after sintering are also referred to as ceramics.

In general formula (1), x representing the abundance of Na in A sites may satisfy $0.80 \leq x \leq 0.95$. If x is less than 0.80, Na is deficient relative to Nb and impurity phases (phases that have similar X-ray diffraction patterns to those of $Ba_4Nb_2O_9$, $Ba_6Ti_7Nb_9O_{42}$, $Ba_3Nb_4Ti_4O_{21}$, and $Ba_3Nb_{3.2}Ti_5O_{21}$) would occur. The resistivity of metal oxide samples that contain many impurity phases is as low as $10^7$ to $10^8$ Ωcm and such metal oxide samples are difficult to polarize.

With x exceeding 0.95, the piezoelectricity is degraded. As long as x is in the range of $0.80 \leq x \leq 0.95$, generation of impurity phases can be suppressed and good piezoelectricity can be obtained. More preferably, $0.80 \leq x \leq 0.93$.

In general formula (1), y representing the abundance of Nb in B sites may satisfy $0.85 \leq y \leq 0.95$. If y is less than 0.85, the curie temperature $T_c$ becomes lower than 140° C. If y exceeds 0.95, the piezoelectricity is degraded. Accordingly, when y is in the range of $0.85 \leq y \leq 0.95$, a curie temperature $T_c$ of 140° C. or higher and good piezoelectricity are obtained.

More preferably, y is in the range of $0.85 \leq y \leq 0.90$ since the Curie temperature $T_c$ lies in the range of about 90° C. to about 230° C. and a polarization treatment can be easily performed. Yet more preferably, y is in the range of $0.88 \leq y \leq 0.90$ since the Curie temperature $T_c$ lies in the range of about 140° C. to about 210° C., a polarization treatment can be easily performed, and the possibility of degradation of piezoelectric performance caused by heat applied during the device production steps is low.

The composition of the piezoelectric material may be determined by any method. For example, the composition may be determined by X-ray fluorescence analysis, inductively coupled plasma (ICP) atomic emission spectroscopy, or atomic absorption spectroscopy. The weight ratios and composition ratios of the respective elements contained in the piezoelectric material can be measured by any of these methods.

A piezoelectric material according to an embodiment of the invention contains a perovskite-type metal oxide represented by general formula (1) and an auxiliary component containing at least one element selected from Si and B. The content of the auxiliary component is 0.001 parts by weight or more and 4.000 parts by weight or less and more preferably 0.003 parts by weight or more and 3.000 parts by weight or less on a metal basis relative to 100 parts by weight of the perovskite-type metal oxide.

The term "on a metal basis" is described next. The piezoelectric material is analyzed by X-ray fluorescence analysis (XRF), ICP atomic emission spectroscopy, atomic absorption spectroscopy, or the like to determine the metal contents of Ba, Na, Ti, and Nb and then the oxide-based contents of the elements constituting the metal oxide represented by general formula (1) are determined therefrom. The total thereof is assumed to be 100 and the ratio of the auxiliary component as a metal or metals to the total weight of 100 is assumed to be the content of the auxiliary component "on a metal basis".

Boron (B) and silicon (Si) segregate at interfaces between crystal grains of the piezoelectric material. This decreases the leakage current flowing in the interfaces between the crystal grains and thus the insulation resistance is increased. The auxiliary component content in the piezoelectric material is preferably 0.001 parts by weight or more in order to increase the insulation resistance. In contrast, when the auxiliary component content is less than 0.001 parts by weight, the insulation resistance is low, which is not desirable. The piezoelectric properties are degraded when the auxiliary component content in the piezoelectric material is more than 4.000 parts by weight. The ratio (G1/G2) of the Si content G1 to the B content G2 may be in the range of $2.0 \leq G1/G2 \leq 3.8$ since appropriate insulation resistance is exhibited within this range. The Si content may be 0.003 parts by weight or more and 1.000 part by weight or less. The B content may be 0.001 parts by weight or more and 1.000 part by weight or less.

A piezoelectric material according to an embodiment of the invention may contain the perovskite-type metal oxide represented by general formula (1) above, the auxiliary component, and a second auxiliary component containing at least one element selected from Mn, Cu, Zn, and Ni. The second auxiliary component content may be 0.050 mol or less and more preferably 0.020 mol or less relative to 1 mol of the perovskite-type metal oxide. The molar contents of Mn, Cu, Zn, and Ni refer to the ratios on a metal basis.

The content of Mn in the second auxiliary component is 0.002 mol or more and 0.040 mol or less relative to 1 mol of the perovskite-type metal oxide. In this range, the mechanical quality factor is improved without degrading the piezoelectric constant. The "mechanical quality factor" here refers to a factor indicating the elastic loss caused by vibration when a piezoelectric ceramic is formed into a vibrator and evaluated as a vibrator. The magnitude of the mechanical quality factor is observed as a sharpness of a resonance curve in impedance measurement. In other words, the mechanical quality factor is a factor that indicates the sharpness of the resonance of a vibrator. It is believed that the insulating properties and the mechanical quality factor are improved when an internal electric field is generated as a result of introduction of defect dipoles by Mn having a different valence from Ti. When an internal electric field is present, a piezoelectric element formed by using the piezoelectric ceramic and driven by applying a voltage can exhibit long-term reliability.

Manganese (Mn) is not limited to metallic Mn and may take any form as long as Mn is contained as a Mn component in the piezoelectric ceramic. For example, Mn may be dissolved in B sites or may be contained in the grain boundaries. The Mn component may take form of metal, ion, oxide, metal salt, or complex in the piezoelectric ceramic.

More preferably, Mn is dissolved in B sites from the viewpoints of insulating properties and ease of sintering.

The content of Cu in the second auxiliary component may be 0.02 mol or less relative to 1 mol of the perovskite-type metal oxide. When 0.02 mol or less of Cu is contained in the piezoelectric material, the resistivity, the electromechanical coupling coefficient, mechanical quality factor, Young's modulus, and density can be increased. Moreover, the sintering temperature can be lowered. The sintering temperature refers to a minimum firing temperature needed to obtain a sintered body having a relative density of 95% or higher. In the case where the spontaneous polarization of the piezoelectric material is pinned, Cu can decrease the pinning of the spontaneous polarization. Once pinning is decreased, the remnant polarization value is increased and coercive field is decreased in polarization-electric field hysteresis curves. Moreover, it becomes easier to orient the directions of the spontaneous polarization by performing a polarization treatment. As a result, the phase difference between the impedance at resonance and the impedance at non-resonance is further increased and the electromechanical coupling coefficient is increased.

Copper (Cu) need not occupy A sites or B sites and may be present at grain boundaries. Copper having a low melting point accelerates liquid phase sintering. As a result, Cu may sometimes segregate in grain boundaries. Once the liquid phase sintering is accelerated, pores in the sintered body are decreased and the density of the sintered body is increased.

As a result of suppressing generation of pores, the mechanical quality factor is increased and the Young's modulus is increased. The distribution of Cu within a sample and the sites occupied by Cu in the crystal can be examined by using an electron microscope or a transmission electron microscope or by energy dispersive X-ray spectrometry, X-ray diffraction, or Raman scattering.

If Cu is contained in an amount exceeding 0.02 mol relative to 1 mol of the perovskite-type metal oxide, impurity phases occur and the piezoelectricity may be degraded.

The content of Zn in the second auxiliary component may be 0.05 mol or less relative to 1 mol of the perovskite-type metal oxide. When the piezoelectric material contains 0.05 mol or less of Zn, the piezoelectric constant, electromechanical coupling coefficient, Young's modulus, and density can be increased. The sintering temperature can be decreased. In the case where the spontaneous polarization of the piezoelectric material is pinned, Zn helps decrease the pinning of the spontaneous polarization. Once pinning is decreased, the remnant polarization value is increased and coercive field is decreased in polarization-electric field hysteresis curves. Moreover, it becomes easier to orient the directions of the spontaneous polarization by performing a polarization treatment. As a result, the phase of the impedance at resonance is drastically changed, and the electromechanical coupling coefficient is increased.

Zinc (Zn) may be present in A sites (twelve coordinated), B sites (six coordinated), or both A and B sites of a perovskite structure or may be present in the grain boundaries of the ceramic.

More preferably, 0.01 mol or less (excluding 0 mol) of Zn and 0.01 mol or less (excluding 0 mol) of Cu are simultaneously contained in the second auxiliary component relative to 1 mol of the perovskite-type metal oxide. When the piezoelectric material contains 0.01 mol or less of Zn and 0.01 mol or less of Cu simultaneously, the resistivity, electromechanical coupling coefficient, mechanical quality factor, piezoelectric constant, and Young's modulus can be increased.

The content Ni of the second auxiliary component may be 0.05 mol or less relative to 1 mol of the perovskite-type metal oxide. When the piezoelectric material contains 0.05 mol or less of Ni, the resistivity, electromechanical coupling coefficient, mechanical quality factor, Young's modulus, and density can be increased. Moreover, the firing temperature can be decreased.

In the case where the spontaneous polarization of the piezoelectric material is pinned, Ni can decrease the pinning of the spontaneous polarization. Once pinning is decreased, remnant polarization value is increased and coercive field is decreased in polarization-electric field hysteresis curves. Moreover, it becomes easier to orient the directions of the spontaneous polarization by performing a polarization treatment. As a result, the phase of the impedance at resonance is more drastically changed and the electromechanical coupling coefficient is increased.

Nickel (Ni) may be present in A sites (twelve coordinated), B sites (six coordinated), or both A sites and B sites of the perovskite structure or may be present in grain boundaries of the ceramic.

In a multilayered piezoelectric element, a piezoelectric material layer interposed between electrodes is thin. Accordingly, the piezoelectric material desirably has durability against high electric fields. Since the piezoelectric material of this embodiment has excellent insulation resistance, the piezoelectric material is suitable for use in a multilayered piezoelectric element.

A piezoelectric material according to an embodiment of the invention may further contain a third auxiliary component containing one or more metal elements other than the aforementioned Ba, Na, Ti, Nb, B, Si, Mn, Cu, Zn, and Ni in addition to the metal oxide represented by general formula (1) above, the auxiliary component, and the second auxiliary component as long as the properties are not changed. Examples of the third auxiliary component include Ge and Sb. The content of the third auxiliary component may be 1.2 parts by weight or less in total relative to 100 parts by weight of the metal oxide represented by general formula (1) above. When the third auxiliary component content exceeds 1.2 parts by weight, the piezoelectric properties and insulating properties of the piezoelectric ceramic may be degraded. The content of the third auxiliary component, i.e., the metal elements other than Ba, Na, Ti, Nb, B, Si, Mn, Cu, Zn, and Ni, is preferably 1.0 part by weight or less on an oxide basis or 0.9 parts by weight or less on a metal basis. For the purposes of the present invention, the "metal element" also refers to a semi-metal element such as Ge and Sb. When the content of the metal elements other than Ba, Na, Ti, Nb, B, Si, Mn, Cu, Zn, and Ni in the third auxiliary component exceeds 1.0 part by weight on an oxide basis or 0.9 parts by weight or less on a metal basis, the piezoelectric properties and insulation properties of the piezoelectric material may be significantly degraded. The total content of Al and Sr in the third auxiliary component may be 0.5 parts by weight or less on a metal basis relative to the piezoelectric material. When the total content of Al and Sr in the third auxiliary component exceeds 0.5 parts by weight on a metal basis relative to the piezoelectric material, insufficient sintering may result. The content of Y in the third auxiliary component may be 0.2 parts by weight or less on a metal basis relative to the piezoelectric material. When the Y content in the third auxiliary component exceeds 0.2 parts by weight on a metal basis relative to the piezoelectric material, it may become difficult to perform a polarization treatment.

The metal oxide represented by general formula (1), the auxiliary component, and the second auxiliary component may account 98.5 mol % or more of the piezoelectric material of the embodiment. The piezoelectric material preferably contains 90 mol % or more and more preferably 95 mol % or more of the perovskite-type metal oxide represented by general formula (1) as a main component.

The contents in terms of parts by weight of the auxiliary component, the second auxiliary component, and the third auxiliary component may be measured by any method. For example, the contents may be measured by X-ray fluorescence analysis, ICP atomic emission spectroscopy, or atomic absorption spectroscopy.

The Curie temperature $T_c$ is a temperature at and beyond which piezoelectricity of a piezoelectric material is lost. For the purposes of the present invention, the temperature at which the dielectric constant is maximal near the ferroelectric-to-paraelectric phase transition temperature is defined to be the Curie temperature $T_c$. The perovskite-type metal oxide of the embodiment has a sequential phase transition temperature in a temperature region lower than the Curie temperature $T_c$. The sequential phase transition temperature is a temperature at which sequential phase transition occurs from a tetragonal ferroelectric phase to an orthorhombic ferroelectric phase. At the sequential phase transition temperature, the dielectric constant shows the maxima or inflection point. Thus, as with the Curie temperature $T_c$, the sequential phase transition temperature can also be determined by evaluating the dependence of the dielectric constant on temperature. For example, a solid solution expressed by $0.9NaNbO_3$-$0.1BaTiO_3$ undergoes phase transitions from orthorhombic to tetragonal and from tetragonal to cubic as the temperature is increased.

The piezoelectric performance is maximal near the sequential phase transition temperature. Accordingly, in the case where a particular piezoelectric performance that does not depend on temperature is needed within the drive temperature range of the device (for example, −30° C. to 60° C.), the sequential phase transition desirably occurs outside the drive temperature range. In the case where the priority is on achieving high piezoelectric performance at a particular temperature rather than making the piezoelectric performance independent from the temperature within the device drive temperature range, the sequential phase transition can be set within the device drive temperature range. A material in which the sequential phase transition temperature can be adjusted in accordance with the specifications of the device has high versatility and is favored.

The piezoelectric material of the embodiment may have a relative density of 90% or more and 100% or less. The relative density refers to a ratio of an actually observed density of a material to a theoretical density calculated from the lattice constant of the piezoelectric material and the atomic weights of the elements that make up the piezoelectric material. The lattice constant can be measured by X-ray diffraction analysis. The density can be measured by an Archimedean method.

At a relative density of less than 90%, insufficient piezoelectric properties and mechanical quality factor may result and the mechanical strength may be decreased. The lower limit of the relative density is more preferably 93% or more.

In the piezoelectric material of the embodiment, 0.03 mol or less of Ti and Nb occupying B sites in NN-BT may be substituted with Zr in order to increase the dielectric constant at room temperature. Substituting B sites with Zr increases the dielectric constant at room temperature and improves piezoelectric performance. When the abundance of Zr in B sites exceeds 0.03 mol, the resistivity is decreased and the firing temperature needed to obtain a sample having a relative density of 95% or higher increases by at least 50° C. Substituting 0.03 mol or less of the B sites with Zr improves the insulation resistance of the piezoelectric material. On the contrary, the resistivity of the piezoelectric material decreases when the abundance of Zr in B sites exceeds 0.03 mol.

In the piezoelectric material of the embodiment, less than 0.20 mol of Ti sites in NN-BT may be substituted with Sn. The Curie temperature $T_c$ and the sequential phase transition temperature of the piezoelectric material of the embodiment can be adjusted according to practical needs by changing the amount of Sn substituting the Ti sites within the range of less than 0.20 mol. For example, the temperature for a polarization treatment can be lowered by adjusting the Curie temperature $T_c$. The piezoelectricity can be made maximal at a particular temperature or the piezoelectric change relative to the temperature can be decreased by adjusting the sequential phase transition temperature. However, if the amount of Sn substituting Ti reaches 0.20 mol or more, the Curie temperature $T_c$ decreases by 60° C. or more compared to when no Sn is contained and the possibility of lowering of piezoelectric performance due to heat applied during the device production steps is increased. When Sn is not contained, the temperature range in which the piezoelectric material of the embodiment is tetragonal is expanded. Accordingly, it is easy to perform a polarization treatment. As long as there is no need to adjust the sequential phase transition temperature by changing the Sn content, the piezoelectric material is desirably free of Sn.

In the piezoelectric material of the embodiment, less than 0.20 mol of Nb sites in NN-BT may be substituted with Ta. The Curie temperature $T_c$ and the sequential phase transition temperature of the piezoelectric material of the embodiment can be adjusted according to practical needs by changing the amount of Ta substituting the Nb sites within the range of less than 0.20 mol. The temperature needed for the polarization treatment can be lowered by adjusting the Curie temperature $T_c$. The piezoelectricity can be made maximal at a particular temperature or the change in piezoelectricity against temperature can be decreased by adjusting the temperature of the sequential phase transition. However, when the amount of Ta substituting Nb is 0.20 mol or more, the Curie temperature $T_c$ is lowered to room temperature. As a result, the possibility of lowering of the piezoelectric performance due to heat applied during the device production steps is significantly increased. Moreover, when firing is performed at a temperature of 1200° C. or lower, it is difficult to dissolve the NN-BT phase and the $NaTaO_3$ phase and the $NaNbO_3$ phase occurs as a second phase. If no Ta is contained, the firing temperature of the piezoelectric material can be made lowest. Accordingly, as long as there is no need to adjust the sequential phase transition temperature by adjusting the Ta content, the piezoelectric material is desirably free of Ta.

Vanadium (V) may substitute 0.20 mol or less of Nb contained in the piezoelectric material of the embodiment. Substituting some of Nb atoms with V can lower the firing temperature of the piezoelectric material.

Lithium (Li) may substitute 0.15 mol or less of Na contained in the piezoelectric material of the embodiment. Substituting some of Na atoms with Li helps improve the Curie temperature $T_c$ of the piezoelectric material.

In general formula (1) representing the oxide metal contained in the piezoelectric material of the embodiment, x may be smaller than y. It is desirable to adjust the compositions of the starting materials so that x is less than y. The insulating property of the sample decreases significantly when x is equal to or greater than y.

The method for producing a piezoelectric material according to the embodiment of the invention is not particularly limited. The method may include a step of sintering a compact body containing Ba, Na, Ti, Nb, and at least one metal element selected from Mn, Cu, Ni, B, and Si, and the temperature of the sintering may be 1200° C. or lower.

To produce a piezoelectric ceramic, a common technique of sintering solid powders of oxides, carbonates, nitrates, oxalates, etc., containing the constitutional elements under normal pressure can be employed. The raw materials are metal compounds such as a Ba compound, a Na compound, a Ti compound, a Nb compound, a B compound, and a Si compound.

Examples of the Ba compound that can be used include barium oxide, barium carbonate, barium oxalate, barium acetate, barium nitrate, barium titanate, and barium zirconate titanate. An example of the Na compound that can be used is sodium carbonate. Examples of the Ti compound that can be used include titanium oxide, barium titanate, barium zirconate titanate, and calcium titanate. Examples of the Nb compound that can be used include niobium oxide and sodium niobate. Examples of the B compound that can be used include boron oxide. Examples of the Si compound that can be used include silicon oxide. Examples of the Mn compound that can be used include manganese carbonate, manganese oxide, manganese dioxide, manganese acetate, and trimanganese tetraoxide. Examples of the Cu compound that can be used include copper(I) oxide, copper(II) oxide, copper carbonate, copper(II) acetate, and copper oxalate. Examples of the Zn compound that can be used include zinc oxide. Examples of the Ni compound that can be used include nickel oxide.

The raw materials for adjusting a representing the molar ratio of the abundance of Ba and Na in A sites to the abundance of Ti and Nb at B sites are not particularly limited. The same effects are yielded irrespective of whether the Ba compound, the Na compound, the Ti compound, or the Nb compound is used.

In the case where the piezoelectric material of the embodiment is to have a sintered body shape, a compact before firing needs to be prepared. The compact refers to a solid article formed by molding raw material powders. The raw material powders desirably have high purity. Examples of the molding method include uniaxial pressing, cold hydrostatic pressing, warm hydrostatic pressing, casting, and extrusion molding. In preparing the compact, granulated powders may be used. When a compact prepared from granulated powders is used, the distribution of the crystal grain size of the resulting sintered body easily becomes uniform.

The method for granulating raw material powders of the piezoelectric material is not particularly limited. From the standpoint of making the granule size of the granulated powder more uniform, a spray dry method may be employed as the granulating method.

Examples of the binder that can be used in granulation include polyvinyl alcohol (PVA), polyvinyl butyral (PVB), and acrylic resins. The amount of the binder added is preferably 1 to 10 parts by weight relative to the raw material powders of the piezoelectric material and more preferably 2 parts by weight to 5 parts by weight from the viewpoint of increasing the density of the compact.

The method for sintering the compact is not particularly limited.

Examples of the sintering method include sintering in an electric furnace, sintering in a gas furnace, an electric heating method, a microwave sintering method, a millimeter wave sintering method, and hot isostatic pressing (HIP). A continuous furnace or a batch furnace may be used for sintering in an electric furnace of a gas furnace.

The sintering temperature employed in the sintering method is not particularly limited but may be a temperature at which the compounds react and sufficient crystal growth occurs. The sintering temperature is preferably 1000° C. or higher and 1200° C. or lower and more preferably 1050° C. or higher and 1160° C. or lower from the viewpoint of controlling the grain size to 1 μm to 10 μm. A piezoelectric material sintered within this temperature range exhibits good piezoelectric performance. In order to stabilize the properties of the piezoelectric material obtained by the sintering treatment while achieving high reproducibility, the sintering treatment may be performed for 2 hours to 48 hours while controlling the sintering temperature constant within the above-described range. A two-stage sintering method may also be employed.

The piezoelectric material obtained by the sintering treatment is polished and may be heat-treated at a temperature equal to or higher than the Curie temperature $T_c$. When the piezoelectric material is mechanically polished, residual stress occurs inside the piezoelectric material. However, the residual stress is relaxed by a heat treatment at a temperature equal to or higher than the Curie temperature $T_c$ and the piezoelectric properties of the piezoelectric material are further improved. The length of time of the heat treatment is not particularly limited but may be 1 hour or longer.

The strength of the piezoelectric material may not be sufficient for cutting and polishing if the crystal grain size exceeds 100 μm on average. The piezoelectricity is degraded if the average grain size is less than 0.3 μm. Accordingly, the average grain size may be within the range of 0.3 μm or more and 100 μm or less.

For the purposes of the invention, the "grain size" refers to what is generally known as "projected area diameter" in the field of microscope observation and means the diameter of a circle having the same area as the projected image of the crystal grain. For the purposes of the invention, the method for measuring the grain size is not particularly limited. For example, the grain size can be determined by image-processing an image of a surface of a piezoelectric material, the image being taken with a polarizing microscope or a scanning electron microscope. Since the optimum magnification differs depending on the grain size to be measured, whichever one of an optical microscope and an electron microscope more suitable for the grain size can be used. The equivalent circle diameter may be determined from the image of a polished surface or a cross section instead of the surface of the material.

In the case where the piezoelectric material of the embodiment is used as a film on a substrate, the thickness of the piezoelectric material is preferably 200 nm or more and 10 μm or less and more preferably 300 nm or more and 3 μm or less. This is because a film of the piezoelectric material having a thickness of 200 nm or more and 10 μm or less exhibits a sufficient electromechanical conversion function as a piezoelectric element.

The method for stacking the film is not particularly limited. Examples of the method include a chemical solution deposition method (CSD method), a sol-gel method, an organic metal chemical vapor deposition method (MOCVD method), a sputtering method, a pulsed laser deposition method (PLD method), a hydrothermal synthesis method, and an aerosol deposition method (AD method). Among these, a chemical solution deposition method and a sputtering method are preferred since films having large areas can be easily formed.

The substrate used together with the piezoelectric material of the embodiment may be a single-crystal substrate cut and polished at a (001) face or a (110) face. When a single crystal substrate cut and polished at a particular crystal surface is used, the piezoelectric material film formed on the surface of the substrate can be strongly oriented in the same direction.

Piezoelectric Element

A piezoelectric element that uses a piezoelectric material according to an embodiment of the present invention will now be described.

FIG. 1 is a schematic view of a piezoelectric element according to an embodiment of the invention. The piezoelectric element includes a first electrode 1, a piezoelectric material portion 2, and a second electrode 3. A piezoelectric material according to an embodiment of the present invention is used as the piezoelectric material constituting the piezoelectric material portion 2.

The piezoelectric properties of the piezoelectric material according to an embodiment of the invention can be assessed by preparing a piezoelectric element that includes a first electrode and a second electrode. The first and second electrodes are each formed of a conductive layer having a thickness of about 5 nm to 10 μm. The material therefor is not particularly limited and any material that is usually used in piezoelectric elements can be used. Examples thereof include metals such as Ti, Pt, Ta, Ir, Sr, In, Sn, Au, Al, Fe, Cr, Ni, Pd, Ag, and Cu and compounds of these.

The first electrode and the second electrode may be composed of one of these materials or may be constituted by two or more of these materials stacked on top of each other. The first electrode may be made of a material different from that of the second electrode.

The method for producing the first electrode and the second electrode is not limited. The electrodes may be formed by baking a metal paste, by sputtering, or by a vapor deposition method, for example. Both the first electrode and the second electrode may be patterned into a desired shape.

The piezoelectric element more preferably has polarization axes oriented in a particular direction. When the polarization axes are oriented in a particular direction, the piezoelectric constant of the piezoelectric element can be increased.

The method for polarizing the piezoelectric element is not particularly limited. The polarization treatment may be conducted in air or oil. The temperature employed for polarization may be 60° C. to 160° C. but the optimum condition slightly differs depending on the composition of the piezoelectric material constituting the piezoelectric element. The electric field applied to perform polarization may be equal to or greater than the coercive field and, in particular, 1 to 5 kV/mm.

The piezoelectric constant and the mechanical quality factor of the piezoelectric element can be determined by calculation based on a Japan Electronics and Information Technology Industries Association standard (JEITA EM-4501) by the observed resonance frequency and antiresonance frequency with a commercially available impedance analyzer. This method is hereinafter referred to as a resonance-antiresonance method.

Multilayered Piezoelectric Element

A multilayered piezoelectric element that uses a piezoelectric material according to an embodiment of the present invention will now be described.

The multilayered piezoelectric element according to an embodiment of the present invention includes piezoelectric material layers and electrode layers that are alternately stacked. The electrode layers include at least one internal electrode. The piezoelectric material layers contain a piezoelectric material according to an embodiment of the invention.

Figure 2A:
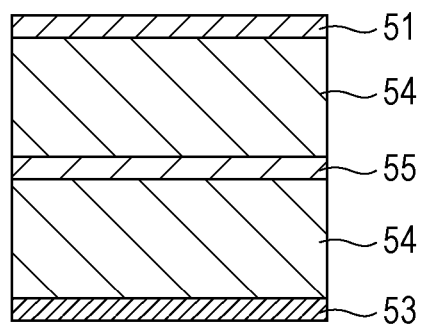
FIGS. 2A and 2B are schematic cross-sectional views showing multilayered piezoelectric elements according to embodiments of the invention.

FIG. 2A is a schematic cross-sectional view of a multilayered piezoelectric element according to an embodiment of the present invention. The multilayered piezoelectric element includes piezoelectric material layers 54 and electrode layers that includes an internal electrode 55, and the piezoelectric material layers 54 and the electrode layers are alternately stacked. The piezoelectric material layers 54 are composed of the piezoelectric material described above. The electrode layers may include external electrodes such as a first electrode 51 and a second electrode 53 in addition to the internal electrode 55.

Figure 2B:
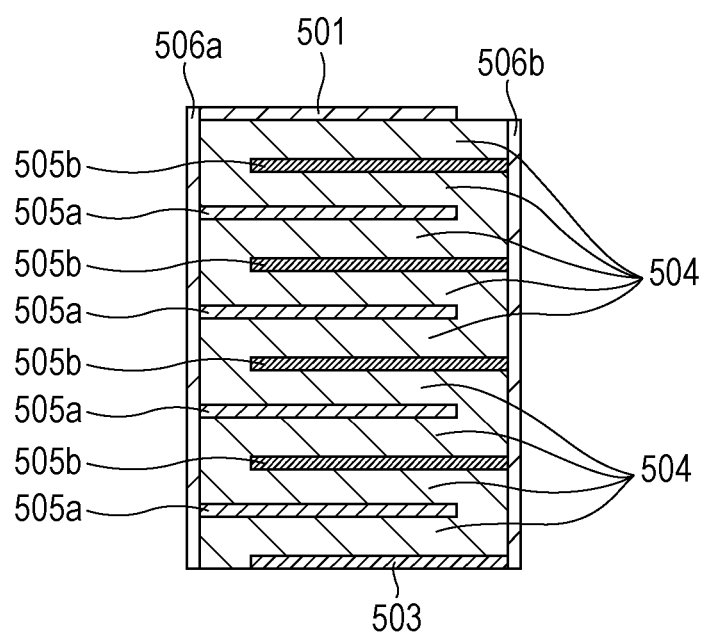

FIG. 2A shows an example of a structure of the multilayered piezoelectric element according to an embodiment of the present invention in which a stack 56 that includes two piezoelectric material layers 54 and the internal electrode 55 that are alternately stacked is held between the first electrode 51 and the second electrode 53. However, as shown in FIG. 2B, the number of the piezoelectric material layers and the number of the internal electrodes may be increased and there is no limit as to the number of the layers. A multilayered piezoelectric element shown in FIG. 2B has a structure in which a stack that includes nine piezoelectric material layers 504 and eight layers of internal electrodes 505 (505a and 505b) that are alternately stacked is held between a first and a second electrode 503. An external electrode 506a and an external electrode 506b are provided to short-circuit the internal electrodes alternately formed.

The shape and size of the internal electrodes 55 and 505 and external electrodes 506a and 506b are not necessarily the same as those of the piezoelectric material layers 54 and 504. The electrodes may be divided into plural parts.

The internal electrodes 55 and 505, the external electrodes 506a and 506b, the first electrodes 51 and 501, and the second electrodes 53 and 503 are each formed of a conductive layer having a thickness of about 5 nm to 2000 nm. The material therefor is not particularly limited and any material that is usually used in piezoelectric elements can be used. Examples thereof include metals such as Ti, Pt, Ta, Ir, Sr, In, Sn, Au, Al, Fe, Cr, Ni, Pd, Ag, and Cu and compounds thereof. The internal electrodes 55 and 505 and the external electrodes 506a and 506b may each be composed of one or of these materials, a mixture of two or more of these materials, or an alloy of two or more of these materials, or may be obtained by stacking two or more of these materials. The respective electrodes may be composed of different materials. From the viewpoint of the cost of electrode material, the internal electrodes 55 and 505 may contain at least one selected from Ni and Cu. When at least one selected from Ni and Cu is used in the internal electrodes 55 and 505, the multilayered piezoelectric element may be fired in a reducing atmosphere.

The internal electrode of a multilayered piezoelectric element according to an embodiment of the invention may contain Ag and Pd and the weight ratio of the weight M1 of Ag contained to the weight M2 of Pd contained (M1/M2) is preferably 1.5≤M1/M2≤9.0 and more preferably 2.3≤M1/M2≤4.0. At a weight content ratio M1/M2 of less than 1.5, the sintering temperature of the internal electrode is increased, which is not desirable. In contrast, when the weight ratio M1/M2 exceeds 9.0, the internal electrode comes to have an island shape and becomes nonuniform in the surface, which is also not desirable.

As shown in FIG. 2B, electrodes including the internal electrodes 505 may be short-circuited to each other in order to achieve phase match of the drive voltage. For example, the internal electrodes 505a may be short-circuited to the first electrode 501 by using the external electrode 506a. The form in which the electrodes are short-circuited to each other is not particularly limited. Electrodes and/or wires for short-circuiting may be formed on side surfaces of the multilayered piezoelectric element, or a through hole penetrating the piezoelectric material layers 504 may be formed and may be filled with a conductive material so as to short-circuit between the electrodes.

Liquid Discharge Head

A liquid discharge head according to an embodiment of the invention includes a liquid chamber that includes a vibrating unit in which the piezoelectric element or the multilayered piezoelectric element described above is contained, and a discharge port communicating with the liquid chamber. The liquid discharged from the liquid discharge head of this embodiment may be any flowing material. For example, water-based liquids and non-water-based liquids such as water, inks, and fuels can be discharged.

Figure 3A:
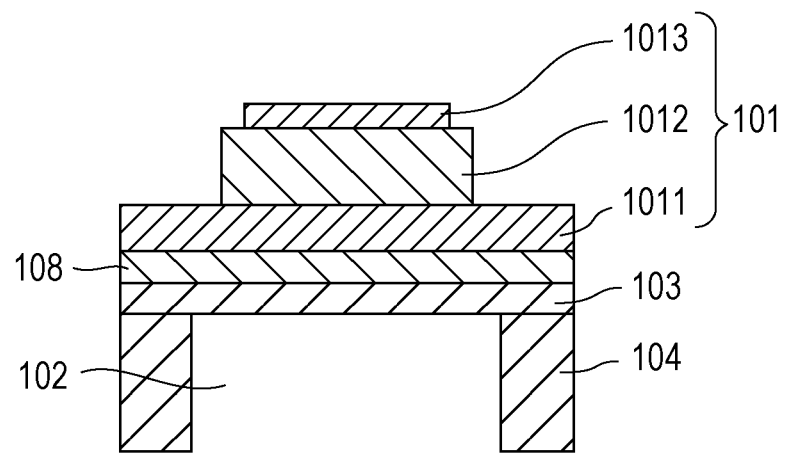
FIGS. 3A and 3B are schematic diagrams showing a liquid discharge head according to one embodiment of the invention.
Figure 3B:
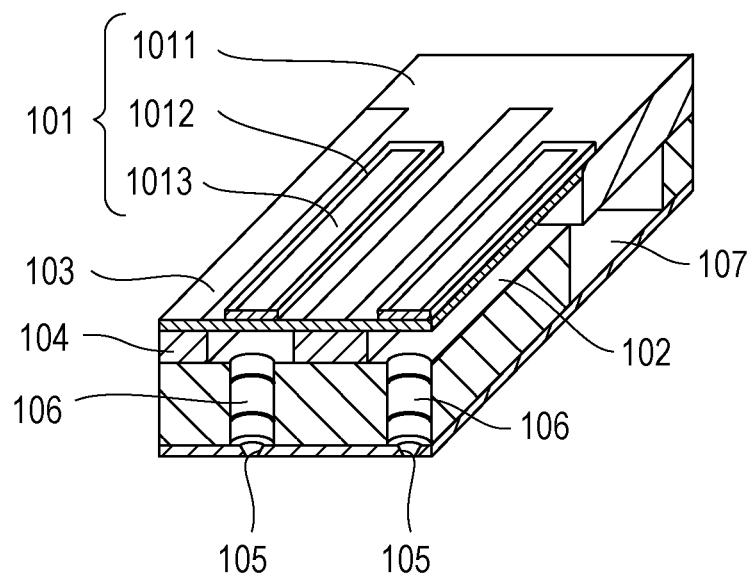

FIGS. 3A and 3B are schematic views showing an example of a structure of a liquid discharge head according to an embodiment of the invention. The liquid discharge head includes a piezoelectric element 101 according to an embodiment of the invention. The piezoelectric element 101 includes a first electrode 1011, a piezoelectric material 1012, and a second electrode 1013. As shown in FIG. 3B, the piezoelectric material 1012 is patterned as needed. FIG. 3B is a schematic view of the liquid discharge head. The liquid discharge head includes discharge ports 105, individual liquid chambers 102, communication holes 106 that connect the individual liquid chambers 102 to the discharge ports 105, liquid chamber partitions 104, a common liquid chamber 107, a diaphragm 103, and the piezoelectric element 101. In the drawing, the piezoelectric element 101 has a rectangular shape but may have any other shape such as an elliptical shape, a round shape, or a rectangular parallelepiped shape. The piezoelectric material 1012 usually has a shape that corresponds to the individual liquid chamber 102.

The piezoelectric element 101 of the liquid discharge head and the nearby portion will now be described in detail by referring to FIG. 3A. FIG. 3A is a cross-sectional view of the piezoelectric element shown in FIG. 3B taken in the width direction. The cross sectional shape of the piezoelectric element 101 is rectangular in the drawing, but may be trapezoidal or inverted trapezoidal. In the drawing, the first electrode 1011 is used as a lower electrode and the second electrode 1013 is used as an upper electrode. However, the arrangement of the first electrode 1011 and the second electrode 1013 is not limited to this. For example, the first electrode 1011 may be used as the lower electrode or the upper electrode and the second electrode 1013 may be used as the upper electrode or the lower electrode. A buffer layer 108 may be present between the diaphragm 103 and the lower electrode. Different names are given to the same parts depending on the device production method and the effects of the present invention are obtained irrespective of how the parts are named.

In the liquid discharge head, the diaphragm 103 moves vertically by expansion and contraction of the piezoelectric material 1012 and applies pressure to the liquid in the individual liquid chamber 102. As a result, the liquid is discharged from the discharge port 105. The liquid discharge head of this embodiment can be used in printers and production of electronic devices. The thickness of the diaphragm 103 is 1.0 μm or more and 15 μm or less and preferably 1.5 μm or more and 8 μm or less. The material for the diaphragm 103 is not particularly limited but is preferably Si which may be doped with phosphorus, boron, or the like. The buffer layer and the electrode on the diaphragm may constitute part of the diaphragm. The thickness of the buffer layer 108 is 5 nm or more and 300 nm or less and preferably 10 nm or more and 200 nm or less. The size of the discharge ports 105 is 5 μm or more and 40 μm or less in terms of equivalent circle diameter. The shape of the discharge ports 105 may be round, star shaped, rectangular shaped, or triangular shaped.

Liquid Discharge Apparatus

A liquid discharge apparatus according to an embodiment of the invention will now be described. The liquid discharge apparatus includes a stage for placing an object, and the liquid discharge head described above.

Figure 4:
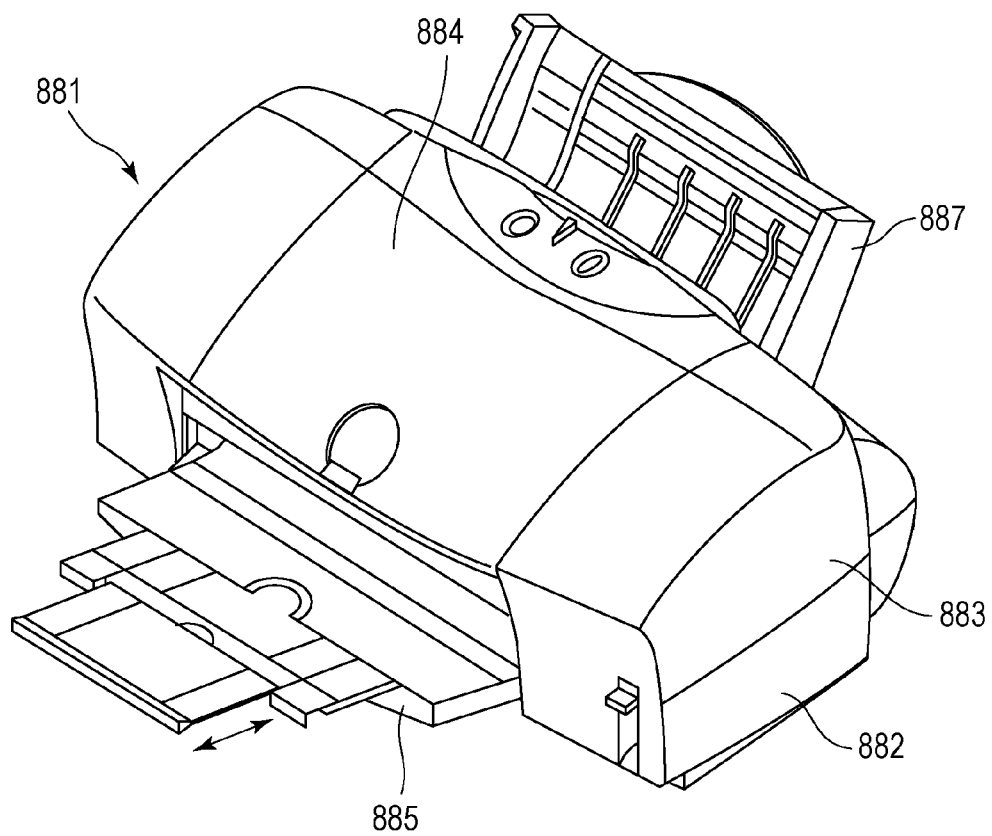
FIG. 4 is a schematic diagram showing a liquid discharge apparatus according to an embodiment of the invention.
Figure 5:
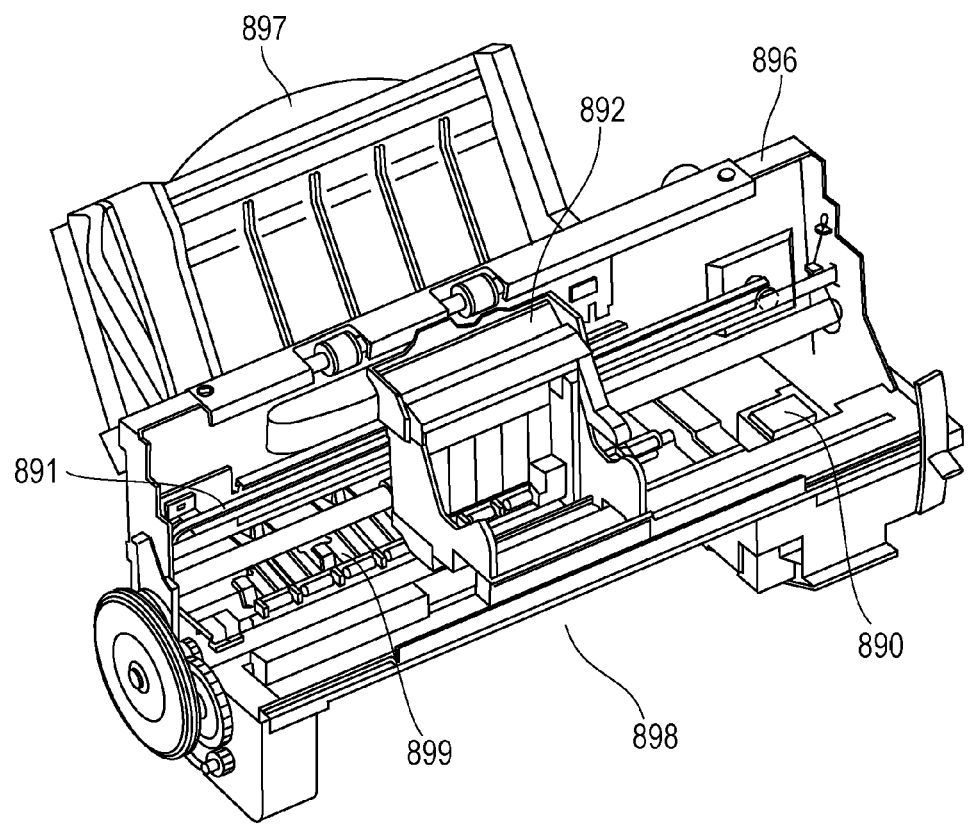
FIG. 5 is a schematic diagram showing the liquid discharge apparatus.

An example of a liquid discharge apparatus according to an embodiment of the invention is an ink jet recording apparatus shown in FIGS. 4 and 5. FIG. 5 illustrates a liquid discharge apparatus (ink jet recording apparatus) 881 shown in FIG. 4 but without outer casings 882 to 885 and 887. The liquid discharge apparatus 881 includes an automatic feeder 897 that automatically feeds a recording paper sheet serving as an object to the interior of a main unit 896. The liquid discharge apparatus 881 also includes a transporting unit 899 that guides the recording paper sheet fed from the automatic feeder 897 to a particular recording position and then from the recording position to a discharge slot 898, a recording unit 891 configured to conduct recording on the recording paper sheet transported to the recording position, and a recovery unit 890 configured to perform a recovery operation on the recording unit 891. The recording unit 891 includes a carriage 892 that houses the liquid discharge head according to an embodiment of the invention and moves back and forth over a rail. The object is not limited to the recording paper sheet and may be any article to which a liquid can be applied. The liquid discharge apparatus includes a stage that serves as a receiving unit so that a liquid can be applied to an object placed on the stage.

In such an ink jet recording apparatus, the carriage 892 moves over the rail in response to an electrical signal output from a computer and a drive voltage is applied to the electrodes sandwiching the piezoelectric material so as to deform the piezoelectric material. As a result of deformation of the piezoelectric material, the individual liquid chamber 102 is pressurized through the diaphragm 103 shown in FIG. 3B and ink is discharged from the discharge port 105 to conduct printing. This liquid discharge apparatus can discharge a liquid uniformly at high speed and can be made compact in size.

Although a printer is given as an example in the aforementioned embodiment, the liquid discharge apparatus of the invention can be used as industrial liquid discharge apparatuses or apparatuses for drawing images etc., on target articles as well as printing apparatuses such as fax machines, multifunction printers, copy machines, and ink jet recording apparatuses. Users can choose a desired object depending on the usage. The liquid discharge head may be configured to move relative to an object placed on a stage serving as the receiving unit.

Ultrasonic Motor

An ultrasonic motor according to an embodiment of the invention includes a vibrating body that includes the piezoelectric element of the multilayered piezoelectric element described above and a moving body that contacts the vibrating body.

Figure 6A:
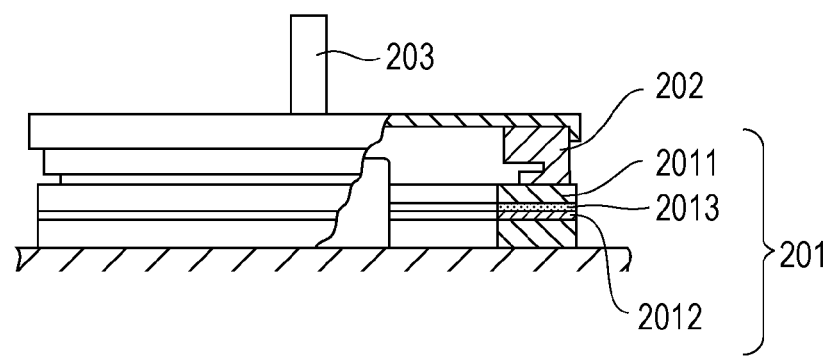
FIGS. 6A and 6B are schematic views showing ultrasonic motors according to embodiments of the invention.
Figure 6B:
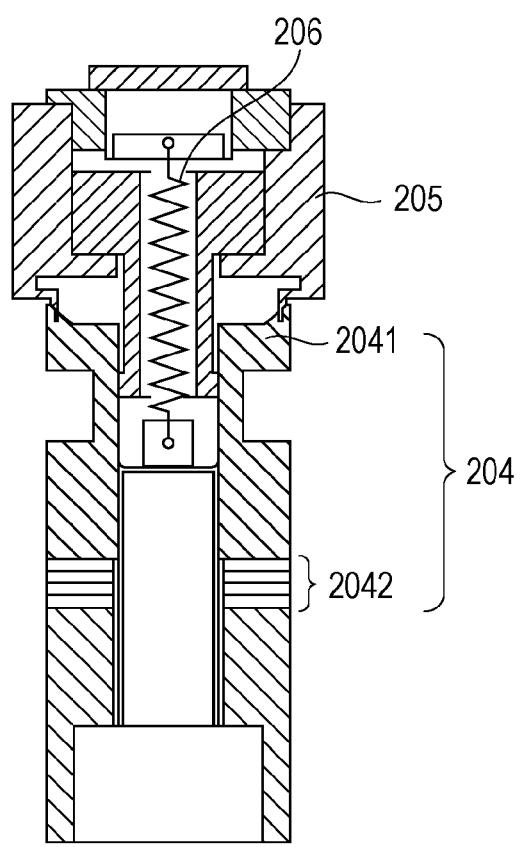

FIGS. 6A and 6B are schematic diagrams showing structures of ultrasonic motors according to embodiments of the present invention. An ultrasonic motor that includes a piezoelectric element of a single plate type according to an embodiment of the present invention is shown in FIG. 6A. The ultrasonic motor includes a vibrator 201, a rotor 202 in pressure-contact with a sliding surface of the vibrator 201 by a pressurizing spring not shown in the drawing, and an output shaft 203 integral with the rotor 202. The vibrator 201 is constituted by a metal elastic ring 2011, a piezoelectric element 2012 according to an embodiment of the invention, and an organic adhesive 2013 (epoxy- or cyanoacrylate-based adhesive, for example) that bonds the piezoelectric element 2012 to the elastic ring 2011.

The piezoelectric element 2012 includes a piezoelectric material and a first electrode and a second electrode (not shown) that sandwich the piezoelectric material. When two phases of alternating voltage having phases shifted by an odd multiple of $\pi/2$ are applied to the piezoelectric element, a bending travelling wave occurs in the vibrator 201 and the respective points on the sliding surface of the vibrator 201 undergo elliptic motion. Since the rotor 202 is in pressure-contact with the sliding surface of the vibrator 201, the rotor 202 receives frictional force from the vibrator 201 and rotates in a direction opposite to the bending travelling wave. An object to be driven not shown in the drawing is coupled to the output shaft 203 and is thus driven by the rotational force of the rotor 202. When a voltage is applied to a piezoelectric material, the piezoelectric material expands and contracts due to the transversal piezoelectric effect. An elastic member such as a metal in contact with the piezoelectric element becomes bended due to expansion and contraction of the piezoelectric material. The types of ultrasonic motors described herein utilize this principle.

An ultrasonic motor that includes a piezoelectric element having a multilayer structure is illustrated in FIG. 6B. A vibrator 204 includes a multilayered piezoelectric element 2042 and a cylindrical metal elastic member 2041 surrounding the multilayered piezoelectric element 2042. The multilayered piezoelectric element 2042 is constituted by plural layers of piezoelectric material not shown in the drawing and includes a first electrode and a second electrode on an outer surface of the stack and internal electrodes inside the stack. The metal elastic member 2041 is held with bolts to fix the multilayered piezoelectric element 2042 and constitutes the vibrator 204. When alternating voltages having different phases are applied to the multilayered piezoelectric element 2042, the vibrator 204 oscillate two different vibrations orthogonal to each other. The two vibrations are combined and form a circular vibration for driving a tip portion of the vibrator 204. An annular groove is formed in the upper portion of the vibrator 204 so as to increase the displacement of vibrations for driving. The rotor 205 is in pressure-contact with the vibrator 204 by a pressurizing spring 206 and gains the frictional force for driving. The rotor 205 is rotatably supported by bearings.

Optical Apparatus

An optical apparatus according to an embodiment of the invention will now be described. The optical apparatus includes a driving unit that includes the ultrasonic motor described above.

Figure 7A:
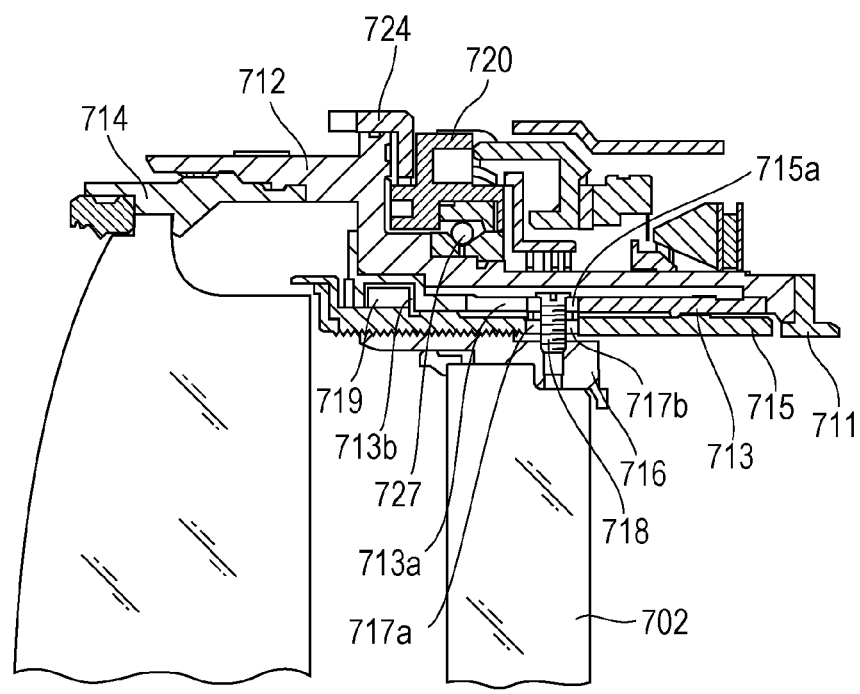
FIGS. 7A and 7B are schematic views showing an optical apparatus according to an embodiment of the invention.
Figure 7B:
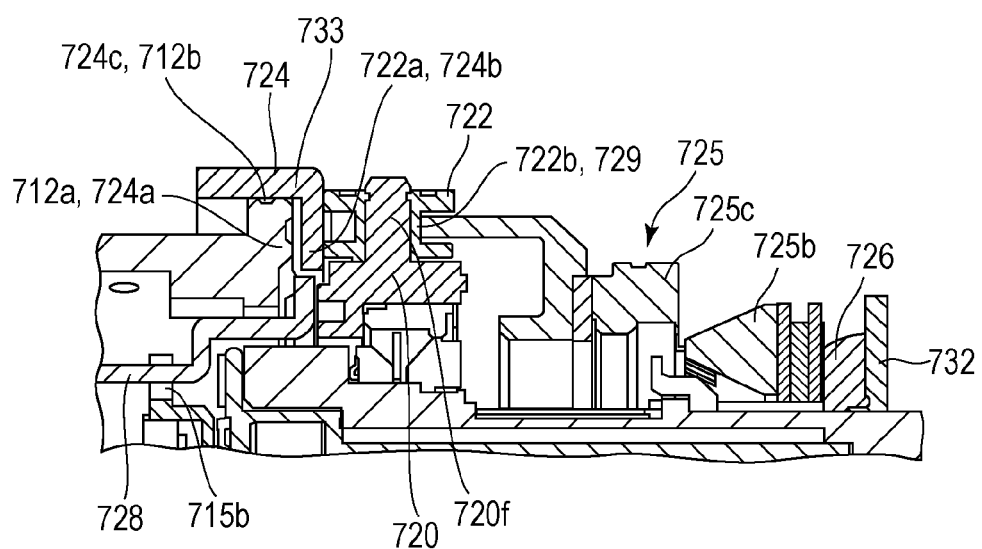
Figure 8:
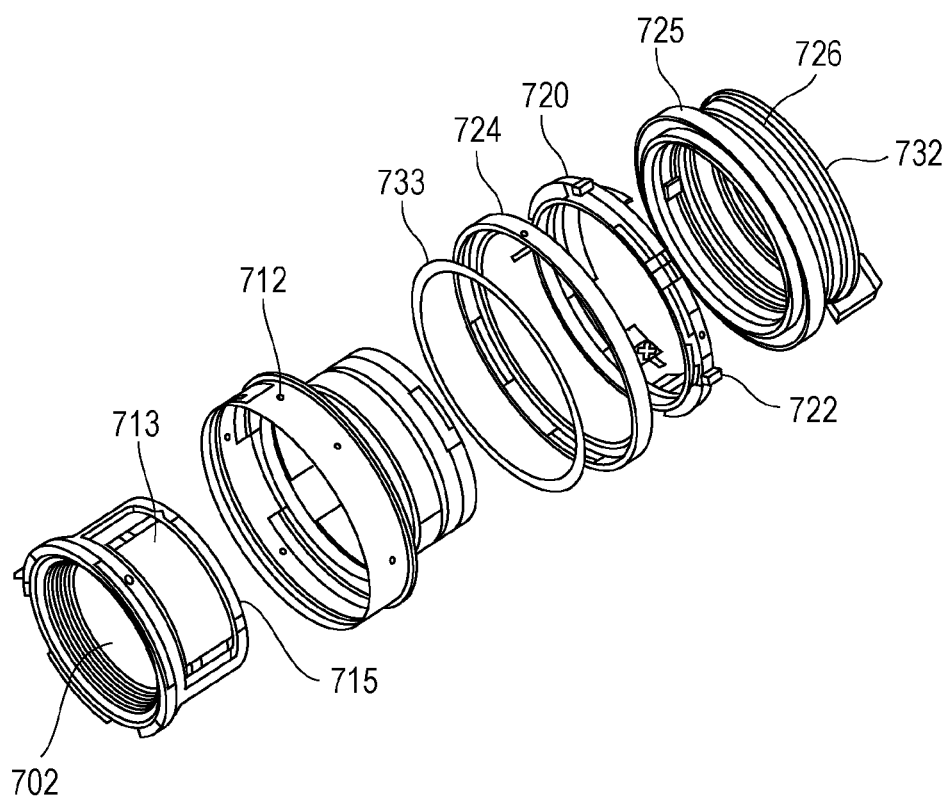
FIG. 8 is a schematic view showing the optical apparatus.

FIGS. 7A and 7B are each a cross-sectional view of a relevant part of a replaceable lens barrel of a singe-lens reflex camera, which is an example of an optical apparatus according to an embodiment of the invention. FIG. 8 is a schematic exploded view of the replaceable lens barrel. A fixed barrel 712, a linear guide barrel 713, and a front lens group barrel 714 are fixed to a mount 711 detachable from and attachable to a camera. These parts are the fixed members of the replaceable lens barrel.

A linear guide groove 713a extending in an optical axis direction is formed in the linear guide barrel 713 to guide a focus lens 702. Cam rollers 717a and 717b that project in an outer radial direction are fixed to a rear group lens barrel 716 with a shaft screw 718 and the cam roller 717a is fitted in the linear guide groove 713a.

A cam ring 715 is rotatably fitted to the inner periphery of the linear guide barrel 713. Relative movement between the linear guide barrel 713 and the cam ring 715 in the optical axis direction is inhibited since a roller 719 fixed to the cam ring 715 is fitted in an annular groove 713b of the linear guide barrel 713. A cam groove 715a for the focus lens 702 is formed in the cam ring 715 and the cam roller 717b is fitted in the cam groove 715a simultaneously.

A rotation transmitting ring 720 is provided on the outer peripheral side of the fixed barrel 712. The rotation transmitting ring 720 is held by a ball race 727 so that it can rotate at a particular position relative to the fixed barrel 712. A roller 722 is rotatably held by a shaft 720f extending in a radial manner from the rotation transmitting ring 720. A large-diameter portion 722a of the roller 722 is in contact with a mount-side end surface 724b of a manual focus ring 724. A small-diameter portion 722b of the roller 722 is in contact with a joint member 729. Six equally spaced rollers 722 are arranged on the outer periphery of the rotation transmitting ring 720 and each roller is configured to have the above-described relationship.

A low-friction sheet (washer member) 733 is disposed on the inner radial portion of the manual focus ring 724. The low-friction sheet 733 is interposed between a mount-side end surface 712a of the fixed barrel 712 and a front-side end surface 724a of the manual focus ring 724. The outer radial surface of the low-friction sheet 733 has a ring shape and is fitted in an inner radial portion 724c. The inner radial portion 724c of the manual focus ring 724 is also fitted in an outer radial portion 712b of the fixed barrel 712. The low-friction sheet 733 reduces the friction in a rotary ring mechanism in which the manual focus ring 724 is rotated relative to the fixed barrel 712 about the optical axis.

The large-diameter portion 722a of the roller 722 and the mount-side end surface 724b of the manual focus ring 724 contact each other under pressure by being pressed by the wave washer 726 that presses the ultrasonic motor 725 toward the front side of the lens. The force from the wave washer 726 pressing the ultrasonic motor 725 toward the front side of the lens also causes the small-diameter portion 722b of the roller 722 and the joint member 729 to contact each other under an adequate degree of pressure. The wave washer 726 is confined from moving in the mount direction by a washer 732 bayonet-mounted to the fixed barrel 712. The spring force (urging force) generated by the wave washer 726 is transmitted to the ultrasonic motor 725 and to the roller 722 and serves as thrusting force of the manual focus ring 724 against the mount-side end surface 712a of the fixed barrel 712. In other words, the manual focus ring 724 is assembled while being urged against the mount-side end surface 712a of the fixed barrel 712 via the low-friction sheet 733.

Accordingly, when the ultrasonic motor 725 is driven and rotated with respect to the fixed barrel 712 by a control not shown in the drawing, the roller 722 rotates about the center of the shaft 720f because the joint member 729 makes frictional contact with the small-diameter portion 722b of the roller 722. As the roller 722 rotates about the shaft 720f, the rotation transmitting ring 720 is rotated about the optical axis (automatic focusing operation).

When rotation force about the optical axis is applied to the manual focus ring 724 from a manual operation input unit not shown in the drawing, the roller 722 rotates about the shaft 720f since the mount-side end surface 724b of the manual focus ring 724 is in pressure-contact with the large-diameter portion 722a of the roller 722. As the large-diameter portion 722a of the roller 722 rotates about the shaft 720f, the rotation transmitting ring 720 is rotated about the optical axis. The ultrasonic motor 725 at this time is prevented from rotating due to the frictional retention force of a rotor 725c and a stator 725b (manual focusing operation).

Two focus keys 728 are installed in the rotation transmitting ring 720 at positions opposite to each other and fitted in notches 715b at the front tip of the cam ring 715. When automatic focusing operation or manual focusing operation is conducted and the rotation transmitting ring 720 is rotated about the optical axis, the rotation force is transmitted to the cam ring 715 via the focus keys 728. When the cam ring 715 is rotated about the optical axis, the rear lens group barrel 716 inhibited from rotating due to the cam roller 717a and the linear guide groove 713a moves back and forth along the cam groove 715a in the cam ring 715 by the cam roller 717b. This drives the focus lens 702 and focusing operation is conducted.

Although a replaceable lens barrel of a single-lens reflex camera has been described as an example of the optical apparatus of the present invention, the scope of the invention is not limited to this. For example, the invention can be applied to any optical apparatus that has an ultrasonic motor in a driving unit irrespective of the type of cameras, such as compact cameras, digital still cameras, or cellular phones with cameras.

Vibrating Apparatus and Dust Removing Device

Vibrating apparatuses for transporting and removing particles, powders, and droplets are widely used in electronic appliances.

A dust removing device that uses a piezoelectric element according to an embodiment of the present invention is described below as an example of a vibrating apparatus of the invention.

A vibrating apparatus according to an embodiment of the invention includes a vibrating body that includes the piezoelectric element or the multilayered piezoelectric element disposed a diaphragm. A dust removing device according to an embodiment of the invention includes a vibrating unit that includes this vibrating apparatus.

Figure 9A:
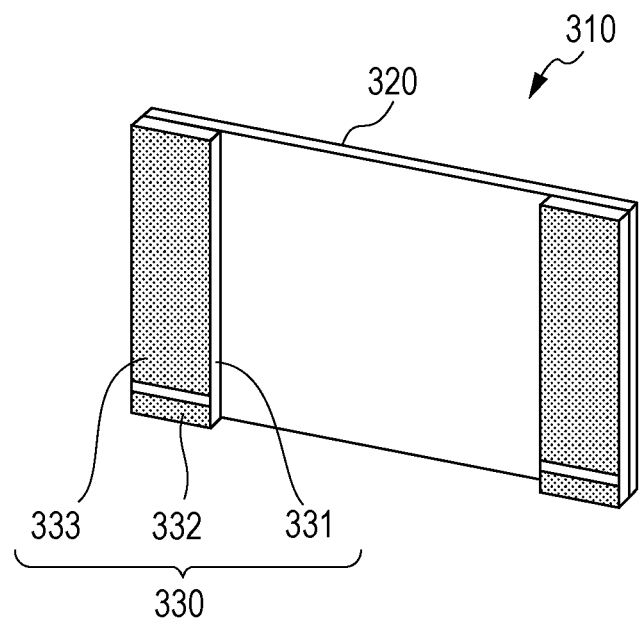
FIGS. 9A and 9B are schematic diagrams showing a vibration apparatus according to an embodiment of the invention used as a dust removing device.
Figure 9B:
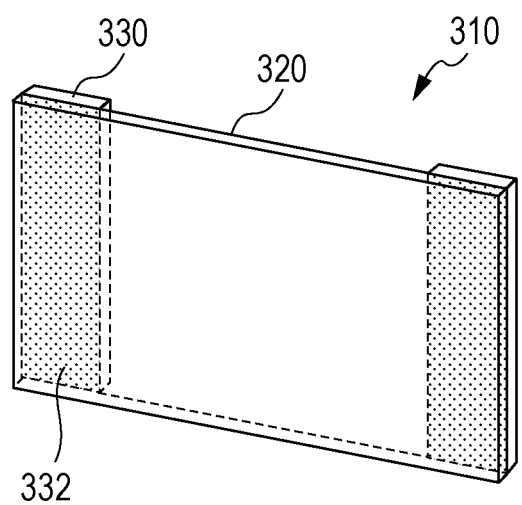

FIGS. 9A and 9B are each a schematic diagram showing an embodiment of a dust removing device. A dust removing device 310 includes a plate-shaped piezoelectric element 330 and a diaphragm 320. The piezoelectric element 330 may be a multilayered piezoelectric element according to an embodiment of the invention. The material for the diaphragm 320 is not limited. When the dust removing device 310 is used in an optical device, a light-transmitting material or light-reflecting material can be used to form the diaphragm 320.

Figure 10A:
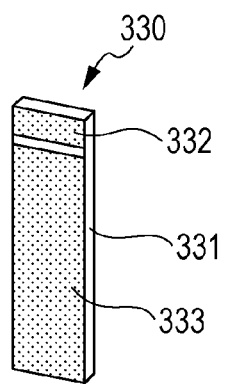
FIGS. 10A to 10C are schematic views of a piezoelectric element used in the dust removing device.
Figure 10B:
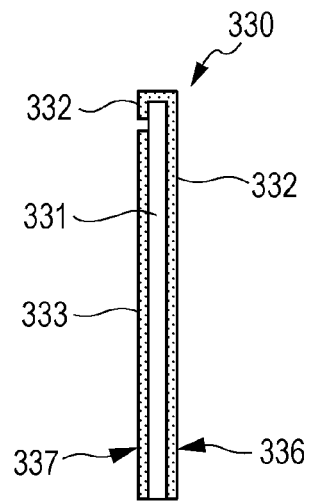
Figure 10C:
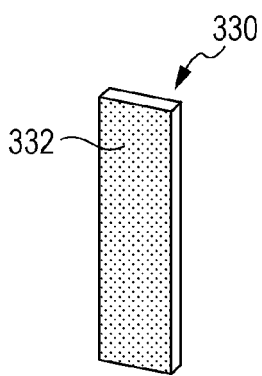

FIGS. 10A to 10C are each a schematic diagram showing a structure of the plate-shaped piezoelectric element 330 shown in FIGS. 9A and 9B. FIGS. 10A and 10C respectively show the structures of the front surface and the back surface of the plate-shaped piezoelectric element 330. FIG. 10B shows a structure of a side surface. As shown in FIGS. 9A and 9B, the plate-shaped piezoelectric element 330 includes a piezoelectric material 331, a first electrode 332, and a second electrode 333. The first electrode 332 and the second electrode 333 are disposed on the surfaces of the piezoelectric material 331 by facing each other. The piezoelectric element 330 may be a multilayered piezoelectric element. In such a case, the piezoelectric material 331 has a structure in which the piezoelectric material layers and the internal electrodes are alternately stacked and the internal electrodes are alternately short-circuited to the first electrode 332 or the second electrode 333 so that a drive waveform having a different phase can be applied to each layer of the piezoelectric material. A surface on which the first electrode 332 is disposed and which is illustrated in FIG. 10C is referred to as a first electrode surface 336 of the piezoelectric element 330. A surface on which the second electrode 333 is disposed and which is illustrated in FIG. 10A is referred to as a second electrode surface 337 of the piezoelectric element 330.

For the purposes of the invention, the "electrode surface" refers to a surface of a piezoelectric element on which an electrode is disposed. For example. As shown in FIG. 10A, the first electrode 332 may extend over to the second electrode surface 337.

As shown in FIGS. 9A and 9B, a pair of piezoelectric elements 330 are fixed to the diaphragm 320. Each piezoelectric element 330 is fixed to the diaphragm 320 with the first electrode surface 336 attached to a surface of the diaphragm 320. As the piezoelectric elements 330 are driven, stress is generated between the piezoelectric elements 330 and the diaphragm 320 and out-of-plane vibrations are generated in the diaphragm 320. The dust removing device 310 according to an embodiment of the invention removes foreign substances such as dust attached to the surface of the diaphragm 320 by using the out-of-plane vibration of the diaphragm 320. The "out-of-plane vibration" refers to an elastic vibration that deforms the diaphragm in the optical axis direction, in other words, the direction of the thickness of the diaphragm.

Figure 11A:
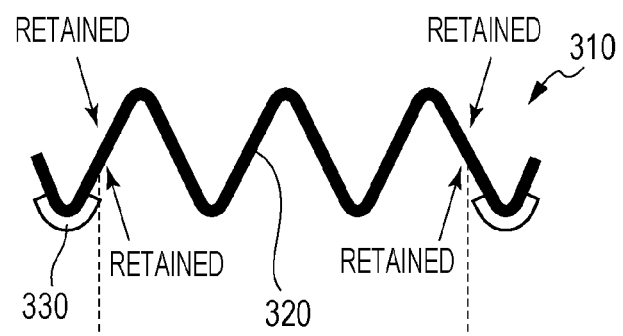
FIGS. 11A and 11B are schematic diagrams illustrating a vibrating principle of the dust removing device.
Figure 11B:
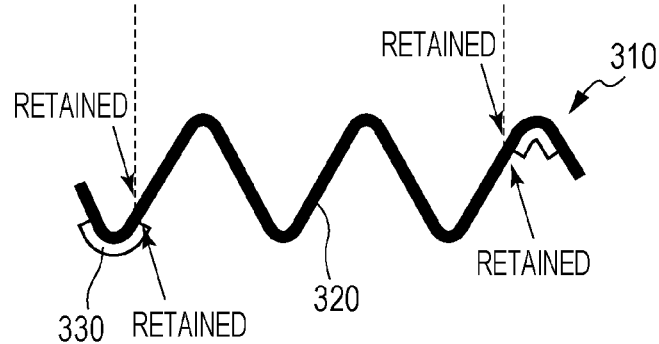

FIGS. 11A and 11B are schematic diagrams showing the principle of vibration of the dust removing device 310 according to an embodiment of the invention. FIG. 11A shows the state in which alternating voltages of the same phase are applied to the pair of piezoelectric elements 330 so as to generate an out-of-plane vibration in the diaphragm 320. The polarization directions of the piezoelectric materials constituting the pair of piezoelectric elements 330 are the same as the direction of the thickness of the piezoelectric element 330. The dust removing device 310 is driven on the seventh vibration mode.

FIG. 11B shows the state in which alternating voltages of the inverted phases 180° different from each other are applied to the pair of piezoelectric elements 330 so as to generate an out-of-plane vibration in the diaphragm 320. The dust removing device 310 is driven on the sixth vibration mode. The dust removing device 310 according to an embodiment of the invention can use any of two vibration modes that suits the condition so as to effectively remove dust attached to the surface of the diaphragm.

Image Pickup Apparatus

Figure 12:
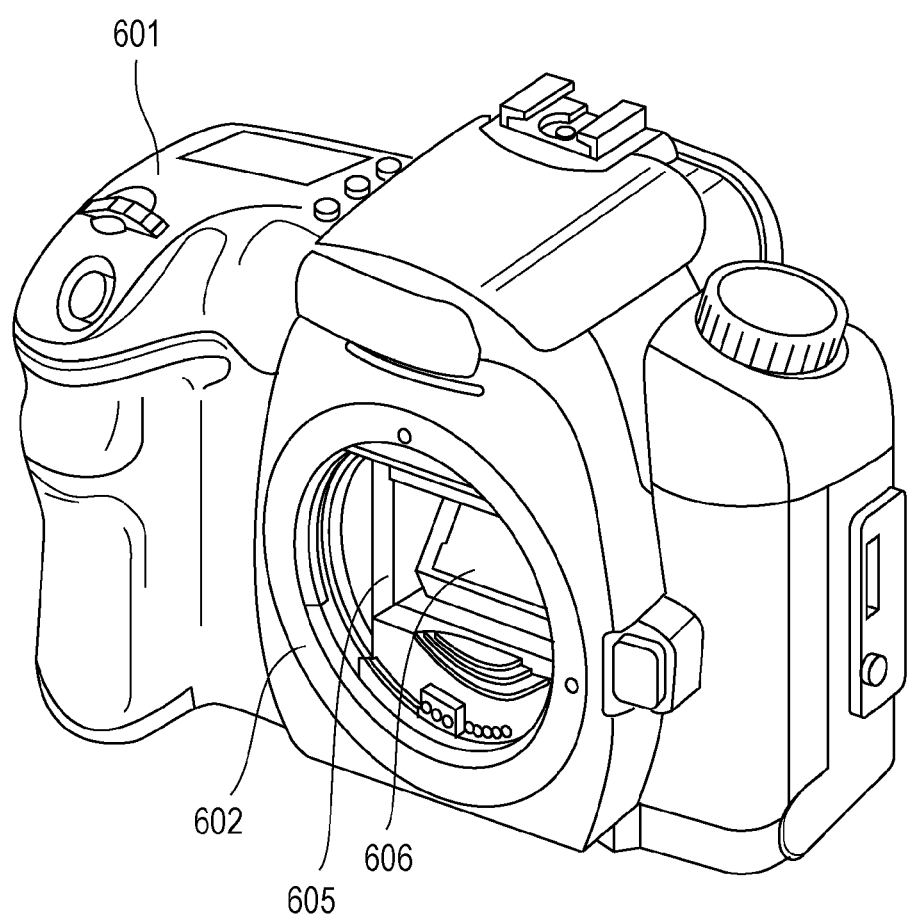
FIG. 12 is a schematic diagram showing an image pickup apparatus according to an embodiment of the invention.
Figure 13:
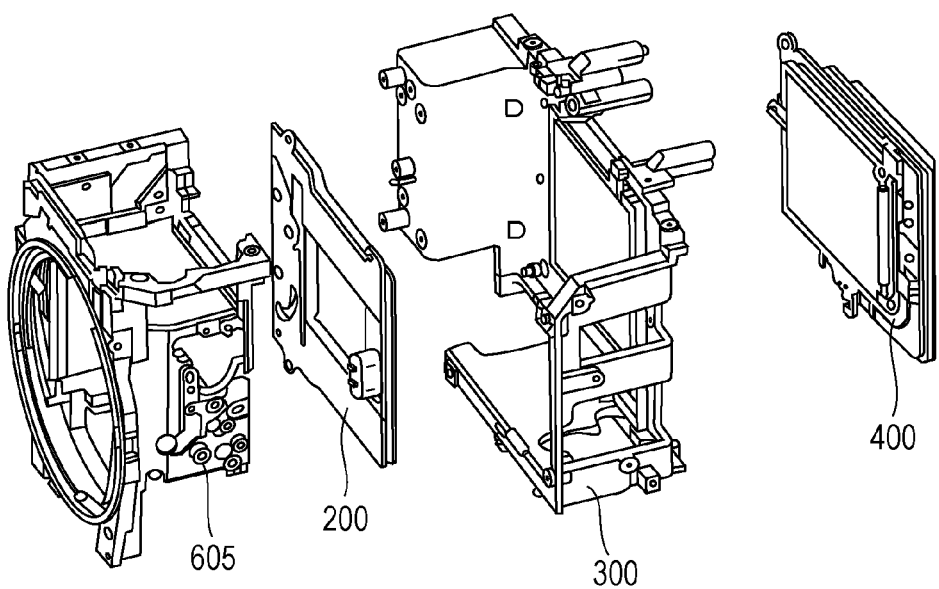
FIG. 13 is a schematic diagram of the image pickup apparatus.

An image pickup apparatus of the present invention will now be described. An image pickup apparatus according to an embodiment of the present invention includes the dust removing device described above and an image pickup element unit. The diaphragm of the dust removing device is provided at a light-receiving-surface side of the image pickup unit and the dust removing device is provided at the light-receiving-surface side of the image pickup element unit. FIGS. 12 and 13 are each a diagram illustrating a digital single-lens reflex camera, which is an image pickup apparatus according to an embodiment of the invention.

FIG. 12 is a front-side perspective view of a camera main body 601 viewed from the subject side. The camera main body 601 in FIG. 12 has an image pickup lens unit removed. FIG. 13 is an exploded perspective view showing a schematic structure of the camera interior, for describing the dust removing device, an image pickup unit 400, and their nearby portions.

A mirror box 605 into which an image light bundle that has passed through a taking lens is guided is disposed inside the camera main body 601. A main mirror (quick return mirror) 606 is disposed in the mirror box 605. The main mirror 606 is configured so that it can be held at an angle of 45° with respect to the image pickup optical axis so as to guide the image light bundle toward a penta-dach mirror (not shown in the drawing) or it can be held at a position avoiding the image light bundle so as to guide the image light bundle into an image pickup element (not shown in the drawing).

The mirror box 605 and a shutter unit 200 are disposed on the subject side of a main body chassis 300 constituting the backbone of the camera main body. The mirror box 605 and the shutter unit 200 are arranged in that order from the subject side. The image pickup unit 400 is disposed on the photographer side of the main body chassis 300. The image pickup unit 400 is arranged so that the image pickup surface of the image pickup element is parallel to a mounting surface of a mount 602, which serves as a reference in attaching an image pickup lens unit, and that a particular distance is secured between the image pickup surface of the image pickup element and the mounting surface of the mount 602.

The image pickup unit 400 includes a vibrating member of a dust removing device and an image pickup element unit. The vibrating member of the dust removing device is disposed on the same axis as the light-receiving surface of the image pickup element unit.

A digital single-lens reflex camera is described above as an example of an image pickup apparatus of the invention. However, the image pickup apparatus is not limited to this and may be an image pickup lens unit-replaceable camera such as a mirror-less digital single-lens reflex camera not equipped with the mirror box 605. The present invention can also be applied to those apparatus and appliances which require removal of dust attaching to surfaces of optical parts, such as various image pickup apparatuses including video cameras with a replaceable image pickup lens unit, copy machines, fax machines, and scanners and electronic and electric appliances equipped with image pickup apparatuses.

Electronic Apparatus

An electronic apparatus according to an embodiment of the invention will now be described. The electronic apparatus includes a piezoelectric acoustic component that includes the piezoelectric element of the multilayered piezoelectric element. Examples of the piezoelectric acoustic component include speakers, buzzers, microphones, and surface acoustic wave (SAW) devices.

Figure 14:
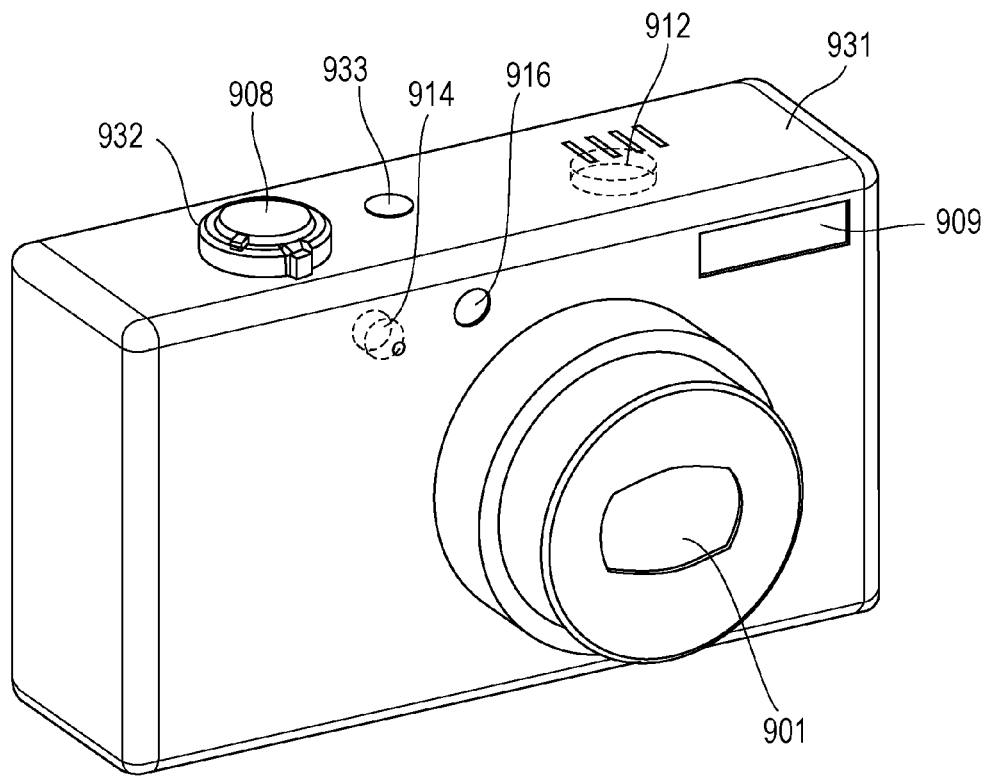
FIG. 14 is a schematic diagram showing an electronic apparatus according to an embodiment of the invention.

FIG. 14 is an overall perspective view of a main body 931 of a digital camera according to an embodiment of the invention. An optical device 901, a microphone 914, a flash 909, and an auxiliary optical part 916 are disposed at the front of the main body 931. Since the microphone 914 is built inside the main body, the microphone 914 is indicated by a dotted line. A hole for picking sound from outside is formed at the front of the microphone 914.

A power button 933, a speaker 912, a zoom lever 932, and a release button 908 for performing focusing operation are arranged on the top surface of the main body 931. The speaker 912 is built inside the main body 931 and is indicated by a dotted line. A hole for transmitting sound to outside is formed at the front of the speaker 912.

A piezoelectric acoustic component according to an embodiment of the invention is used in at least one of the microphone 914, the speaker 912, and a SAW device.

A digital camera is described above as an example of an electronic apparatus of the invention. However, the electronic apparatus is not limited to this and the present invention may be applied to those electronic appliances which have piezoelectric acoustic components, such as sound reproducing apparatuses, sound recording apparatuses, cellular phones, and information terminals.

As has been described above, a piezoelectric element and a multilayered piezoelectric element according to embodiments of the present invention can be used in liquid discharge heads, liquid discharge apparatuses, ultrasonic motors, optical apparatuses, vibrating apparatuses, dust removing devices, image pickup apparatuses, and electronic apparatuses.

Because the piezoelectric element and the multilayered piezoelectric element according to the invention are used, a liquid discharge head that has a nozzle density and a discharge speed comparable or superior to those of a liquid discharge head that uses lead-containing piezoelectric elements can be provided.

A liquid discharge apparatus that has discharge speed and discharge accuracy comparable or superior to those of a liquid discharge apparatus that uses lead-containing piezoelectric elements can be provided by using the liquid discharge head according to the invention. An ultrasonic motor that has driving force and durability comparable or superior to those of an ultrasonic motor that uses a lead-containing piezoelectric element can be provided by using the piezoelectric element and the multilayered piezoelectric element according to the present invention.

An optical apparatus that has durability and operation accuracy comparable or superior to those of an optical apparatus that uses a lead-containing piezoelectric element can be provided by using the ultrasonic motor according to the invention.

A vibrating apparatus that has vibrating performance and durability comparable or superior to those of a vibrating apparatus that uses a lead-containing piezoelectric element can be provided by using the piezoelectric element and the multilayered piezoelectric element according to the invention.

A dust removing device that has dust removing efficiency and durability comparable or superior to those of a dust removing device that uses a lead-containing piezoelectric element can be provided by using the vibrating apparatus according to the present invention.

An image pickup apparatus that has dust removing performance comparable or superior to that of an image pickup apparatus that uses a lead-containing piezoelectric element can be provided by using the dust removing device according to the invention.

An electronic apparatus that has sound creating performance comparable or superior to that of an electronic apparatus that use s a lead-containing piezoelectric element can be provided by using a piezoelectric acoustic component that includes the piezoelectric element or the multilayered piezoelectric element according to the present invention.

A piezoelectric material according to the present invention can be used in liquid discharge heads, motors, ultrasonic vibrators, piezoelectric actuators, piezoelectric sensors, ferroelectric memories, and other devices.

EXAMPLES

A piezoelectric material according to an embodiment of the present invention will now be described in further detail through Examples below. The scope of the present invention is not limited by the examples described below.

Examples 1 to 24 and Comparative Examples 1 to 10

Table 1 shows compositions of piezoelectric materials of Examples 1 to 24 and sintered bodies of Comparative Examples 1 to 10.

TABLE 1

| Sample | Basic composition | | | | Second auxiliary component | | | | Auxiliary component | | |
|---|---|---|---|---|---|---|---|---|---|---|---|
| | x/y | x' | x | y | Cu (mol) | Ni (mol) | Zn (mol) | Mn (mol) | Si (pbw) | B (pbw) | Total (pbw) |
| Ex. 1 | 0.97 | 0.85 | 0.82 | 0.85 | 0 | 0 | 0 | 0 | 0.014 | 0.0066 | 0.0206 |
| Ex. 2 | 0.97 | 0.88 | 0.85 | 0.88 | 0 | 0 | 0 | 0 | 0.014 | 0.0066 | 0.0206 |
| Ex. 3 | 0.97 | 0.95 | 0.92 | 0.95 | 0 | 0 | 0 | 0 | 0.014 | 0.0066 | 0.0206 |
| Ex. 4 | 0.93 | 0.88 | 0.82 | 0.88 | 0 | 0 | 0 | 0 | 0.014 | 0.0066 | 0.0206 |
| Ex. 5 | 0.99 | 0.88 | 0.87 | 0.88 | 0 | 0 | 0 | 0 | 0.014 | 0.0066 | 0.0206 |
| Ex. 6 | 0.97 | 0.88 | 0.85 | 0.88 | 0 | 0 | 0 | 0 | 0.018 | 0.0066 | 0.0246 |
| Ex. 7 | 0.97 | 0.88 | 0.85 | 0.88 | 0 | 0 | 0 | 0 | 0.02 | 0.0066 | 0.0266 |
| Ex. 8 | 0.97 | 0.88 | 0.85 | 0.88 | 0 | 0 | 0 | 0 | 0.024 | 0.0066 | 0.0306 |
| Ex. 9 | 0.97 | 0.88 | 0.85 | 0.88 | 0 | 0 | 0 | 0 | 0.008 | 0.0033 | 0.0113 |
| Ex. 10 | 0.97 | 0.88 | 0.85 | 0.88 | 0 | 0 | 0 | 0 | 0.01 | 0.0033 | 0.0133 |
| Ex. 11 | 0.97 | 0.88 | 0.85 | 0.88 | 0 | 0 | 0 | 0 | 0.012 | 0.0033 | 0.0153 |
| Ex. 12 | 0.97 | 0.88 | 0.85 | 0.88 | 0 | 0 | 0 | 0 | 0.04 | 0.0199 | 0.0599 |
| Ex. 13 | 0.97 | 0.88 | 0.85 | 0.88 | 0 | 0 | 0 | 0 | 0.05 | 0.0199 | 0.0699 |
| Ex. 14 | 0.97 | 0.88 | 0.85 | 0.88 | 0 | 0 | 0 | 0 | 0.06 | 0.0199 | 0.0799 |
| Ex. 15 | 0.97 | 0.88 | 0.85 | 0.88 | 0 | 0 | 0 | 0 | 0.07 | 0.0199 | 0.0899 |
| Ex. 16 | 0.97 | 0.88 | 0.85 | 0.88 | 0 | 0 | 0 | 0 | 0.07 | 0.0299 | 0.0999 |
| Ex. 17 | 0.97 | 0.88 | 0.85 | 0.88 | 0 | 0 | 0 | 0 | 0.1 | 0.0299 | 0.1299 |
| Ex. 18 | 0.97 | 0.88 | 0.85 | 0.88 | 0 | 0 | 0 | 0 | 4 | 0 | 4 |
| Ex. 19 | 0.97 | 0.88 | 0.85 | 0.88 | 0 | 0 | 0 | 0 | 0 | 4 | 4 |
| Ex. 20 | 0.97 | 0.88 | 0.85 | 0.88 | 0.002 | 0 | 0 | 0 | 0.014 | 0.0066 | 0.0206 |
| Ex. 21 | 0.97 | 0.88 | 0.85 | 0.88 | 0.005 | 0 | 0 | 0 | 0.014 | 0.0066 | 0.0206 |
| Ex. 22 | 0.97 | 0.88 | 0.85 | 0.88 | 0 | 0.005 | 0 | 0 | 0.014 | 0.0066 | 0.0206 |
| Ex. 23 | 0.97 | 0.88 | 0.85 | 0.88 | 0 | 0 | 0.01 | 0 | 0.014 | 0.0066 | 0.0206 |
| Ex. 24 | 0.97 | 0.88 | 0.85 | 0.88 | 0 | 0 | 0.01 | 0.002 | 0.014 | 0.0066 | 0.0206 |
| C. Ex. 1 | 0.97 | 0.88 | 0.85 | 0.88 | 0 | 0 | 0 | 0 | 0 | 0 | 0 |
| C. Ex. 2 | 1.02 | 0.89 | 0.90 | 0.88 | 0 | 0 | 0 | 0 | 0.014 | 0.0066 | 0.0206 |
| C. Ex. 3 | 0.86 | 0.98 | 0.76 | 0.88 | 0 | 0 | 0 | 0 | 0.014 | 0.0066 | 0.0206 |
| C. Ex. 4 | 1.14 | 1.01 | 1.00 | 0.88 | 0 | 0 | 0 | 0 | 0.014 | 0.0066 | 0.0206 |
| C. Ex. 5 | 0.97 | 0.83 | 0.81 | 0.83 | 0 | 0 | 0 | 0 | 0.014 | 0.0066 | 0.0206 |
| C. Ex. 6 | 0.97 | 0.96 | 0.93 | 0.96 | 0 | 0 | 0 | 0 | 0.014 | 0.0066 | 0.0206 |
| C. Ex. 7 | 0.97 | 0.88 | 0.85 | 0.88 | 0 | 0 | 0 | 0 | 0.014 | 0.0299 | 0.0439 |
| C. Ex. 8 | 0.97 | 0.88 | 0.85 | 0.88 | 0 | 0 | 0 | 0 | 0.02 | 0.0299 | 0.0499 |
| C. Ex. 9 | 0.97 | 0.88 | 0.85 | 0.88 | 0 | 0 | 0 | 0 | 5 | 0 | 5 |
| C. Ex. 10 | 0.97 | 0.88 | 0.85 | 0.88 | 0 | 0 | 0 | 0 | 0 | 5 | 5 |

In the table, Ex. denotes Example, C. Ex. denotes Comparative Example, and pbw denotes parts by weight.

Raw materials were weighed so that values of x' and y described in Table 1 were satisfied in general formula (1), $(Na_xBa_{1-y})(Nb_yTi_{1-y})O_3$. Raw materials for the second auxiliary component were weighed in terms of number of moles relative to 1 mol of the perovskite-type metal oxide represented by general formula (1). In Table 1, x' representing the Na content at the time of feeding and x represents the compositional ratio after firing. The raw material powders were mixed in a ball mill for 12 hours.

A sodium niobate ($NaNbO_3$) powder having a purity of 99% or higher, a barium carbonate ($BaCO_3$) powder having a purity of 99.95%, and a barium titanate ($BaTiO_3$) powder having a purity of 99% or higher were used as the raw materials in Comparative Examples 1 to 8 and Examples 1 to 19.

A sodium niobate ($NaNbO_3$) powder having a purity of 99% or higher, a barium carbonate ($BaCO_3$) powder having a purity of 99.95%, a barium titanate ($BaTiO_3$) powder having a purity of 99% or higher, and a copper oxide (Cu(II)O) powder having a purity of 99.9% were used as the raw materials in Examples 20 and 21. Note that the Cu content in Example 20 was 0.002 mol, which indicates that 0.159 g of CuO (or 0.127 g of Cu) is contained per mole (172.2 g) of the perovskite-type metal oxide represented by general formula (1).

A sodium niobate ($NaNbO_3$) powder having a purity of 99% or higher, a barium carbonate ($BaCO_3$) powder having a purity of 99.95%, a barium titanate ($BaTiO_3$) powder having a purity of 99% or higher, and a nickel oxide (Ni(II)O) powder having a purity of 99.9% or higher were used as the raw materials in Example 22.

A sodium niobate ($NaNbO_3$) powder having a purity of 99% or higher, a barium carbonate ($BaCO_3$) powder having a purity of 99.95%, a barium titanate ($BaTiO_3$) powder having a purity of 99% or higher, and a zinc oxide (Zn(II)O) powder having a purity of 99.99% or higher were used as the raw materials in Example 23.

A trimanganese tetraoxide ($Mn_3O_4$) powder having a purity of 99.9% or higher and the raw materials used in Example 23 were used as the raw materials in Example 24.

The resulting mixture was calcined for 2 to 5 hours in air at 900° C. to 1100° C. In Examples 1 to 24 and Comparative Examples 1 to 10, the calcined powder was pulverized, Si and B serving as the auxiliary component were added in amounts (parts by weight) indicated by Table 1 relative to the weight of the calcined powder, and 3 wt % of a PVB binder was added to conduct granulation. In Comparative Example 1, the calcined powder was pulverized and 3 wt % of a PVB binder was added relative to the weight of the calcined powder so as to conduct granulation without adding Si and B. A mold was filled with the granulated powder and the granulated powder in the mold was compressed at 200 MPa so as to form a compact having a diameter of 17 mm and a thickness of about 1 mm. The resulting compact was fired in air at 1000° C. to 1200° C. for 2 to 6 hours to obtain a sintered body.

The density of the sintered body was measured by an Archimedean method and a relative density was calculated. All of the sintered bodies of Examples had a relative density of 95% or higher. Comparison of Examples 1 to 19 with Comparative Example 1 shows that samples containing Si and B exhibited a density comparable or superior to that of samples not containing Si and B although the temperatures of calcining and main firing were decreased by 50° C. to 100° C.

Each sintered body was polished to a thickness of about 0.5 mm. The polished sintered body or a powder obtained by pulverizing the polished sintered body were used to conduct X-ray diffraction to examine the phase and the lattice constant. The X-ray diffraction confirmed that the samples all had a single perovskite structure phase.

The composition of each sintered body was examined by inductively coupled plasma atomic emission spectroscopy. In Table 1, x represents the molar ratio of Na. The intended contents were achieved in all elements except Na. In all samples, the Na content was lower than the target value. In all samples except Comparative Examples 2 and 3, the ratio of the number of moles of Na to the number of moles of Nb (x/y) was within the range of 93% to 99%. The grain size in the sintered body was examined by observation with an optical microscope or an electron microscope.

The grain size of the sintered body observed with an electron microscope was within the range of 2 to 50 μm.

The distributions of Si and B in the sintered body were examined by energy dispersive X-ray spectroscopy. Almost all of Si and B atoms added were found at the grain boundaries between grains.

Piezoelectric elements of Examples 1 to 24 and Comparative Examples 1 to 10 were prepared in order to examine electrical properties such as piezoelectric properties and insulation resistance. First, in order to remove the stress inside the polished sintered body and the organic components on the surface, each sintered body was heat-treated in air for 30 minutes at 400° C. to 500° C. A gold electrode having a thickness of 400 nm was formed on each of two surfaces of the resulting disk-shaped ceramic by DC sputtering. A titanium film having a thickness of 30 nm was formed as an adhesive layer between the electrode and the ceramic. The ceramic with the electrodes was cut to prepare a rectangular piezoelectric element 10 mm (length)×2.5 mm (width)×0.5 mm (thickness) in size.

The resistivity was measured with a semiconductor parameter analyzer. A DC voltage of several ten to 100 volt was applied to each sample and the resistance 30 seconds after start of application of voltage was measured. The resistivity was calculated from the observed resistance and the size of the sample. A piezoelectric material or a piezoelectric element can be considered to exhibit sufficient practical insulating properties as long as this resistivity is 30 GΩ·cm or more and preferably 100 GΩ·cm or more.

Prior to examining the piezoelectric properties, a polarization treatment was conducted. In particular, a sample was placed in an oil bath held at 150° C., a voltage of 1.5 to 5 kV/mm was applied to the sample for 30 minutes, and the sample was cooled to room temperature while applying the voltage. In Comparative Examples 9 and 10, the insulation resistance was low and thus the polarization treatment involving high voltage could not be performed and the piezoelectric constant was low.

The piezoelectric constant ($d_{31}$) and the mechanical quality factor (Qm) of each rectangular piezoelectric element were measured by a resonance-antiresonance method. The Curie temperature was measured with an impedance analyzer. The dielectric constant was measured with an impedance analyzer at a measurement frequency of 1 kHz and an applied alternating voltage of 500 mV. Measurement was conducted after the polarization treatment. In examining the dependency of the dielectric constant on temperature, the measurement of the dielectric constant was started from room temperature. The sample was cooled from room temperature to −100° C. and then heated to 350° C. to record the change in dielectric constant. The Curie temperature $T_c$ was calculated from the maxima of the dielectric constant.

The properties of each sample are shown in Tables 2 and 3.

TABLE 2

|  | Sintering temperature [° C.] | Sintering density [g/cm³] | Piezoelectric constant $d_{31}$ [pm/V] | Mechanical quality factor Qm [—] | Curie temperature [° C.] |
|---|---|---|---|---|---|
| Ex. 1 | 1050 | 97 | −60 | 400 | 135 |
| Ex. 2 | 1050 | 98 | −63 | 420 | 195 |
| Ex. 3 | 1060 | 96 | −61 | 390 | 255 |
| Ex. 4 | 1060 | 96 | −60 | 430 | 200 |
| Ex. 5 | 1060 | 95 | −62 | 370 | 190 |
| Ex. 6 | 1050 | 97 | −62 | 410 | 195 |
| Ex. 7 | 1050 | 96 | −59 | 380 | 195 |
| Ex. 8 | 1050 | 95 | −58 | 390 | 195 |
| Ex. 9 | 1050 | 98 | −59 | 440 | 195 |
| Ex. 10 | 1050 | 97 | −55 | 460 | 195 |
| Ex. 11 | 1050 | 97 | −56 | 420 | 195 |
| Ex. 12 | 1050 | 98 | −57 | 380 | 195 |
| Ex. 13 | 1050 | 97 | −55 | 390 | 195 |
| Ex. 14 | 1050 | 96 | −53 | 400 | 195 |
| Ex. 15 | 1050 | 96 | −54 | 370 | 195 |
| Ex. 16 | 1050 | 97 | −56 | 350 | 195 |
| Ex. 17 | 1050 | 95 | −55 | 370 | 195 |
| Ex. 18 | 1020 | 95 | −51 | 300 | 190 |
| Ex. 19 | 1020 | 95 | −50 | 310 | 190 |
| Ex. 20 | 1050 | 98 | −60 | 560 | 190 |
| Ex. 21 | 1050 | 98 | −62 | 530 | 185 |
| Ex. 22 | 1020 | 96 | −61 | 315 | 190 |
| Ex. 23 | 1020 | 97 | −63 | 334 | 195 |
| Ex. 24 | 1000 | 96 | −67 | 420 | 190 |
| C. Ex. 1 | 1200 | 94 | −41 | 327 | 195 |
| C. Ex. 2 | 1100 | 92 | −28 | 340 | 185 |
| C. Ex. 3 | 1100 | 87 | −28 | 310 | 260 |
| C. Ex. 4 | 1100 | 96 | −36 | 395 | 140 |
| C. Ex. 5 | 1100 | 95 | −30 | 415 | 110 |
| C. Ex. 6 | 1100 | 93 | −24 | 280 | 265 |
| C. Ex. 7 | 1100 | 96 | −40 | 340 | 195 |
| C. Ex. 8 | 1100 | 95 | −42 | 320 | 195 |
| C. Ex. 9 | 1000 | 88 | −21 | 100 | 180 |
| C. Ex. 10 | 1000 | 87 | −17 | 80 | 160 |

In the table, Ex. denotes Example and C. Ex. denotes Comparative Example.

TABLE 3

| Sample | Resistivity [GΩ · cm] |
|---|---|
| Example 1 | 900 |
| Example 2 | 2200 |
| Example 3 | 1800 |
| Example 4 | 1200 |
| Example 5 | 1400 |
| Example 6 | 2000 |
| Example 7 | 1600 |
| Example 8 | 1700 |
| Example 9 | 1600 |
| Example 10 | 1500 |
| Example 11 | 1300 |
| Example 12 | 1200 |
| Example 13 | 1100 |
| Example 14 | 950 |
| Example 15 | 860 |
| Example 16 | 700 |
| Example 17 | 600 |
| Example 18 | 450 |
| Example 19 | 400 |

TABLE 3-continued

| Sample | Resistivity [GΩ·cm] |
|---|---|
| Example 20 | 2800 |
| Example 21 | 3600 |
| Example 22 | 1600 |
| Example 23 | 420 |
| Example 24 | 5600 |
| Comparative Example 1 | 16 |
| Comparative Example 2 | 300 |
| Comparative Example 3 | 210 |
| Comparative Example 9 | 100 |
| Comparative Example 10 | 150 |

Evaluation of Piezoelectric Materials and Piezoelectric Elements of Examples 1 to 19

The samples of Examples 1 to 19 each has a composition based on NN-BT with Si and B added thereto. As shown in Table 2, compared with Comparative Example 1 in which Si and B were not added, the piezoelectric constant $d_{31}$ and the mechanical quality factor Qm were high in Examples 1 to 19 but substantially no change was observed in the Curie temperature $T_c$.

As shown in Table 3, a high resistivity was observed in samples containing up to a total of 4 parts by weight of Si and B but the resistivity started to decrease as the total content of Si and B exceeded 5 parts by weight as shown by Comparative Examples 9 and 10.

Evaluation of Examples 20 to 24

In samples having a composition based on NN-BT with a total of 0.02 parts by weight of Si and B as the auxiliary component and 0.002 or 0.005 mol of Cu as the second auxiliary component (Examples 20 and 21), the piezoelectric constant $d_{31}$ was higher by about 10% and the mechanical quality factor Qm was larger by 100 to 200 than the samples that did not contain the second auxiliary component. A decrease of several degrees Celsius was observed in the Curie temperature Tc.

In samples having a composition based on NN-BT with a total to 0.02 parts by weight of Si and B as the auxiliary component and 0.005 mol of Ni as the second auxiliary component (Example 22), the piezoelectric constant $d_{31}$ was higher by about 10% than the samples that did not contain the second auxiliary component. However, the mechanical quality factor Qm and the Curie temperature $T_c$ were not substantially different from those of the samples that did not contain the second auxiliary component.

In samples having a composition based on NN-BT with a total of 0.02 parts by weight of Si and B as the auxiliary component and 0.01 mol of Zn as the second auxiliary component (Example 23), the piezoelectric constant $d_{31}$ was higher by about 15% compared to the samples that did not contain the second auxiliary component. The mechanical quality factor Qm and the Curie temperature $T_c$ were not substantially different from those of the samples that did not contain the second auxiliary component.

In samples having a composition based on NN-BT with a total of 0.02 parts by weight of Si and B as the auxiliary component and 0.01 mol of Zn and 0.002 mol of Mn as the second auxiliary component (Example 24), the piezoelectric constant $d_{31}$ was higher by about 20% than the samples that did not contain the second auxiliary component. The mechanical quality factor Qm and the Curie temperature $T_c$ were not substantially different from those of the samples that did not contain the second auxiliary component.

Example 25

The raw materials that correspond to Example 2 were weighed according to the following procedure.

A sodium carbonate ($Na_2CO_3$) powder, a niobium oxide ($Nb_2O_5$) powder, and a barium titanate ($BaTiO_3$) powder were weighed such that the Na, Nb, Ba, and Ti contents were the same as the composition of Example 2 shown in Table 1. The weighed raw material powders were mixed in a ball mill overnight. The resulting powder mixture was calcined at 950° C. and pulverized.

To 100 parts by weight of the pulverized powder, 0.014 parts by weight of Si and 0.066 parts by weight of B were added and the resulting mixture was further mixed in a ball mill overnight to obtain a powder mixture. To the powder mixture, a solvent, a binder (PVB), and a plasticizer (dibutyl phthalate) were added to prepare a slurry. The slurry was formed into green sheets having a thickness of 50 μm by a doctor blade method.

A conductive paste for forming internal electrodes was applied to each green sheet by printing. The conductive paste was a Ag 70%-Pd 30% alloy (Ag/Pd=2.33) paste. Nine green sheets with the conductive paste applied thereto were stacked and the stack was fired for 5 hours at 1050° C. to prepare a sintered body. The sintered body was cut to a size of 10 mm×2.5 mm and side surfaces were polished. A pair of external electrodes (first and second electrodes) that alternately short-circuit the internal electrodes were formed on the side surfaces by Au sputtering so as to prepare a multilayered piezoelectric element shown in FIG. 2B.

The internal electrodes of the multilayered piezoelectric element were observed. According to the observation, layers of the electrode material Ag—Pd were alternately stacked with layers of the piezoelectric material.

Prior to examining the piezoelectricity, each sample was subjected to a polarization treatment. In particular, the sample was heated to 150° C. in an oil bath, a voltage of 2 kV/mm was applied between the first and second electrode for 30 minutes, and the sample was cooled to room temperature while applying the voltage.

The piezoelectricity of the multilayered piezoelectric element obtained thereby was evaluated. The multilayered piezoelectric element had sufficient insulating properties and piezoelectric properties comparable to those of the piezoelectric material of Example 2 were obtained.

Example 26

The raw materials that correspond to Example 2 were weighed according to the following procedure.

A sodium carbonate ($Na_2CO_3$) powder, a niobium oxide ($Nb_2O_5$) powder, and a barium titanate ($BaTiO_3$) powder were weighed such that the Na, Nb, Ba, and Ti contents were the same as the composition of Example 2 shown in Table 1. The weighed raw material powders were mixed in a ball mill for 12 hours. The resulting powder mixture was calcined at 950° C. and pulverized.

To 100 parts by weight of the pulverized powder, 0.014 parts by weight of Si and 0.066 parts by weight of B were added and the resulting mixture was further mixed in a ball mill overnight to obtain a powder mixture. To the powder mixture, a solvent, a binder (PVB), and a plasticizer (dibutyl phthalate) were added to prepare a slurry. The slurry was formed into green sheets having a thickness of 50 μm by a doctor blade method.

A conductive paste for forming internal electrodes was applied to each green sheet by printing. The conductive paste was a Ni paste. Nine green sheets with the conductive paste applied thereto were stacked and the stack was thermally press-bonded.

The press-bonded stack was fired in a tubular furnace. Firing was conducted in air up to 300° C. After the binder was removed, the atmosphere was switched to a reducing atmosphere ($H_2:N_2=2:98$, oxygen concentration: $2\times10^{-6}$ Pa), and a temperature of 1100° C. was held for 5 hours. During the process of decreasing the temperature, the oxygen concentration was changed to 30 Pa at 1000° C. or lower and cooling was conducted to room temperature.

The sintered body obtained as such was cut to a size of 10 mm×2.5 mm. The side surfaces of the sintered body were polished and a pair of external electrodes (first and second electrodes) that alternately short-circuit the internal electrodes were formed by Au sputtering so as to prepare a multilayered piezoelectric element shown in FIG. 2B.

The internal electrodes of the multilayered piezoelectric element were observed. According to the observation, layers of the electrode material Ni were alternately stacked with layers of the piezoelectric material. The multilayered piezoelectric element was placed in an oil bath held at 150° C. and a 2 kV/mm electric field was applied to the multilayered piezoelectric element for 30 minutes to conduct a polarization treatment.

The piezoelectric properties of the multilayered piezoelectric element obtained thereby were evaluated. The multilayered piezoelectric element had sufficient insulating properties and piezoelectric properties comparable to those of the piezoelectric element of Example 2 were obtained.

Example 27

A liquid discharge head shown in FIG. 3 was fabricated by using the piezoelectric element of Example 2. It was confirmed that the liquid discharge head discharged ink in response to an input electrical signal.

Example 28

A liquid discharge apparatus shown in FIG. 4 was fabricated by using the liquid discharge head of Example 27. It was confirmed that the liquid discharge apparatus discharged ink on a recording medium in response to an input electrical signal.

Example 29

An ultrasonic motor shown in FIG. 6A was fabricated by using the piezoelectric element of Example 2. It was confirmed that the ultrasonic motor rotated in response to application of alternating voltage.

Example 30

An optical apparatus shown in FIGS. 7A and 7B was fabricated by using the ultrasonic motor of Example 29. It was confirmed that automatic focusing operation was performed in response to application of alternating voltage.

Example 31

A dust removing device shown in FIGS. 9A and 9B was fabricated by using the piezoelectric element of Example 12. Plastic beads were scattered onto the apparatus and alternating voltage was applied to the apparatus. It was confirmed that the dust removing device exhibited good dust removing rate.

Example 32

An image pickup apparatus shown in FIG. 12 was fabricated by using the dust removing device of Example 31. When the image pickup apparatus was operated, dust on the surface of the image pickup unit was satisfactorily removed and an image without defects caused by dust was obtained.

Example 33

A liquid discharge head shown in FIGS. 3A and 3B was fabricated by using the multilayered piezoelectric elements of Examples 25 and 26. It was confirmed that ink was discharged in response to an input electrical signal.

Example 34

A liquid discharge apparatus shown in FIG. 4 was fabricated by using the liquid discharge head of Example 33. It was confirmed that the ink was discharged on a recording medium in response to an input electrical signal.

Example 35

An ultrasonic motor shown in FIG. 6B was fabricated by using the multilayered piezoelectric elements of Examples 25 and 26. It was confirmed that the motor rotated in response to application of alternating voltage.

Example 36

An optical apparatus shown in FIGS. 7A and 7B was fabricated by using the ultrasonic motor of Example 35. It was confirmed that automatic focusing operation was carried out in response to application of alternating voltage.

Example 37

A dust removing device shown in FIGS. 9A and 9B was fabricated by using the multilayered piezoelectric elements of Examples 25 and 26. Plastic beads were scattered on the apparatus and alternating voltage was applied to the apparatus. It was confirmed that the apparatus exhibited a satisfactory dust removing rate.

Example 38

An image pickup apparatus shown in FIG. 12 was fabricated by using the dust removing device of Example 37. When the image pickup apparatus was operated, dust on the surface of the image pickup unit was satisfactorily removed and an image without defects caused by dust was obtained.

Example 39

An electronic apparatus shown in FIG. 14 was fabricated by using the multilayered piezoelectric elements of Examples 25 and 26. It was confirmed that the speaker was operated in response to application of alternating voltage.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

INDUSTRIAL APPLICABILITY

Piezoelectric materials according to embodiments of the invention do not contain lead and thus have low impact on the environment. Accordingly, the piezoelectric materials can be efficiently used in appliances that use a large quantity of piezoelectric materials, such as liquid discharge heads, ultrasonic motors, and dust removing devices.

REFERENCE SIGNS LIST 1 first electrode
2 piezoelectric material portion
3 second electrode
101 piezoelectric element
102 individual liquid chamber
103 diaphragm
104 liquid chamber partition
105 discharge port
106 communication hole
107 common liquid chamber
108 buffer layer
1011 first electrode
1012 piezoelectric material
1013 second electrode
201 vibrator
202 rotor
203 output shaft
204 vibrator
205 rotor
206 spring
2011 elastic ring
2012 piezoelectric element
2013 organic adhesive
2041 metal elastic member
2042 multilayered piezoelectric element
310 dust removing device
320 diaphragm
330 piezoelectric element
331 piezoelectric material
332 first electrode
333 second electrode
336 first electrode surface
337 second electrode surface
310 dust removing device
320 diaphragm
330 piezoelectric element
51 first electrode
53 second electrode
54 piezoelectric material layer
55 internal electrode
56 stack
501 first electrode
503 second electrode
504 piezoelectric material layer
505a internal electrode
505b internal electrode
506a external electrode
506b external electrode
601 camera main body
602 mount
605 mirror box
606 main mirror
200 shutter unit
300 main body chassis
400 image pickup unit
702 rear group lens (focus lens)
711 mount
712 fixed barrel
713 linear guide barrel
714 front lens group barrel
715 cam ring
716 rear group lens barrel
717 cam roller
718 shaft screw
719 roller
720 rotation transmitting ring
722 roller
724 manual focus ring
725 ultrasonic motor
726 wave washer
727 ball race
728 focus key
729 joint member
732 washer
733 low-friction sheet
881 liquid discharge apparatus
882 outer casing
883 outer casing
884 outer casing
885 outer casing
887 outer casing
890 recovery unit
891 recording unit
892 carriage
896 main unit
897 automatic feeder
898 discharge slot
899 transporting unit
901 optical device
908 release button
909 flash
912 speaker
914 microphone
916 auxiliary optical part
931 main body
932 zoom lever
933 power button

The invention claimed is:

1. A piezoelectric material comprising:
Na, Ba, Nb, Ti, and at least one of Si and B,
wherein a ratio "y" of a content (mol) of Nb with respect to a total content (mol) of Nb and Ti is $0.85 \leq y \leq 0.95$,
a ratio "x" of a content (mol) of Na with respect to the total content (mol) of Nb and Ti is $0.80 \leq x \leq 0.95$,
a ratio "b" of a content (mol) of Ba with respect to the total content (mol) of Nb and Ti is $0.05 \leq b \leq 0.15$, and
a total content (part by weight) of Si and B is 0.001 parts by weight or more and 4.000 parts by weight or less with respect to 100 parts by weight of an oxide including Na, Ba, Nb and Ti.

2. The piezoelectric material according to claim 1, further comprising:
at least one element selected from the group consisting of Mn, Cu, Zn, and Ni,
wherein a content of the element selected from the group consisting of Mn, Cu, Zn, and Ni is 0.05 mol or less relative to 1 mol of the perovskite-type metal oxide.

3. The piezoelectric material according to claim 1, wherein $x < y$.

4. A piezoelectric element comprising:
a first electrode;
a piezoelectric material portion; and
a second electrode,
wherein the piezoelectric material portion contains the piezoelectric material according to claim 1.

5. A multilayered piezoelectric element comprising:
two or more piezoelectric material layers; and
electrode layers including one or more internal electrodes,
wherein the piezoelectric material layers and the electrode layers are alternately stacked and the piezoelectric material layers contain the piezoelectric material according to claim 1.

6. The multilayered piezoelectric element according to claim 5, wherein the internal electrodes contain Ag and Pd and a weight ratio M1/M2 satisfies $1.5 \leq M1/M2 \leq 9.0$ where M1 represents a content of Ag in terms of weight and M2 represents a content of Pd in terms of weight.

7. The multilayered piezoelectric element according to claim 5, wherein the internal electrodes contain at least one element selected from the group consisting of Ni and Cu.

8. An electronic apparatus comprising:
the piezoelectric element according to claim 4.

9. An electronic apparatus comprising:
the multilayered piezoelectric element according to claim 5.

* * * * *